United States Patent
Shigihara et al.

(10) Patent No.: US 6,907,057 B2
(45) Date of Patent: Jun. 14, 2005

(54) SEMICONDUCTOR OPTICAL DEVICE AND SEMICONDUCTOR LASER MODULE USING THE SEMICONDUCTOR OPTICAL DEVICE

(75) Inventors: Kimio Shigihara, Hyogo (JP); Kazushige Kawasaki, Hyogo (JP); Hiromasu Matsuoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 130 days.

(21) Appl. No.: 10/636,657

(22) Filed: Aug. 8, 2003

(65) Prior Publication Data

US 2004/0047383 A1  Mar. 11, 2004

Related U.S. Application Data

(63) Continuation-in-part of application No. 10/314,966, filed on Dec. 10, 2002, now abandoned.

(30) Foreign Application Priority Data

Sep. 5, 2002 (JP) .......... 2002-259983
May 14, 2003 (JP) .......... 2003-135986

(51) Int. Cl.$^7$ .............. H01S 5/00
(52) U.S. Cl. .............. 372/49; 257/436
(58) Field of Search .............. 372/75, 6, 19, 372/11, 99, 101, 43–50

(56) References Cited

FOREIGN PATENT DOCUMENTS

| JP | 10-186104 | 7/1998 |
| JP | 2001-196685 | 7/2001 |

*Primary Examiner*—Minsun Oh Harvey
*Assistant Examiner*—Tuan N. Nguyen
(74) *Attorney, Agent, or Firm*—Leydig, Voit & Mayer, Ltd.

(57) ABSTRACT

A nonreflective film includes films having refractive indices higher than 1 and a high-refractive index film (first film, third film, fifth film) and a low-refractive index film (second film, fourth film, sixth film, seventh film) respectively having refractive indices higher and lower than the square root of an effective refractive index of a semiconductor laser. The films have least three different compositions. Each film has a single composition. The films bring a real part and an imaginary part of an amplitude reflectance to zero, as a whole. Therefore, a semiconductor optical device with an improved degree of freedom in design of the nonreflective film is provided, even when a total thickness of the films is different from one quarter wavelength of the incident light.

10 Claims, 31 Drawing Sheets

SEMICONDUCTOR OPTICAL DEVICE AND SEMICONDUCTOR LASER MODULE USING THE SEMICONDUCTOR OPTICAL DEVICE

This disclosure is a continuation-in-part of U.S. patent application Ser. No. 10/314,966 filed Dec. 10, 2002, now abandoned.

BACKGROUND OF THE INVENTION

1. Field of the Invention

The present invention relates to a semiconductor optical device including a semiconductor optical element which emits light, and to a semiconductor laser module using the semiconductor optical device.

2. Description of the Background Art

A structure of a conventional semiconductor optical device, which is disclosed in Japanese Patent Laying-Open No. 2001-196685, will now be described with reference to FIG. 19. As shown in FIG. 19, the conventional semiconductor optical device includes a semiconductor laser 101, which is an example of the semiconductor optical element and which has an effective refractive index $n_c$, and a nonreflective film provided in contact with a light emission surface of semiconductor laser 101.

In addition, the nonreflective film includes a first film 102 provided in contact with an end surface of semiconductor laser 101 and having a refractive index $n_1$ and a thickness $d_1$, a second film 103 provided in contact with an end surface of first film 102 and having a refractive index $n_2$ and a thickness $d_2$, and a third film 104 provided in contact with an end surface of second film 103 and having a refractive index $n_3$ and a thickness $d_3$.

FIG. 20 shows wavelength dependence data of a reflectance of a nonreflective film used in a semiconductor laser having an effective refractive index $n_c=3.2$. The data shown in FIG. 20 shows wavelength dependence of the reflectance of the nonreflective film when the semiconductor laser emits light having a wavelength $\lambda=1.3\mu m$.

Data 105 in FIG. 20 shows wavelength dependence of the reflectance of a nonreflective film of alumina having refractive index $n_1=1.6$ and thickness $d_1=106.2$ nm, amorphous silicon having refractive index $n_2=3.2$ and thickness $d_2=10.6$ nm, and silicon oxide having refractive index $n_3=1.45$ and thickness $d_3=73.9$ nm.

Data 106 in FIG. 20 shows wavelength dependence of the reflectance of a nonreflective film of alumina having refractive index $n_1=1.6$ and thickness $d_1=512.5$ nm, amorphous silicon having refractive index $n_2=3.2$ and thickness $d_2=10.6$ nm, and silicon oxide having refractive index $n_3=1.45$ and thickness $d_3=73.9$ nm.

When the effective refractive index of semiconductor laser 101 is $n_c=3.2$, the refractive index, which is the square root of the effective refractive index, is $n_f=1.78885$. In addition, when the light has wavelength $\lambda=1.3$ $\mu m$, one quarter wavelength $\lambda$ is 325 nm.

As shown in data 105 of the wavelength dependence, when the total film thickness of the above-mentioned three kinds of films $(d_1 \times n_1 + d_2 \times n_2 + d_3 \times n_3)$ is nearly equal to a quarter of $\lambda$, a range of a wavelength (referred to as a "low-reflectance wavelength range" hereinafter), wherein the nonreflective film functions with a low reflectance equal to or lower than 1%, is 257 nm.

On the other hand, as shown in data 106 of the wavelength dependence, when the total film thickness of the three films $(d_1 \times n_1 + d_2 \times n_2 + d_3 \times n_3)$ is changed to about 961 nm in order to enhance the thermal conductivity of the nonreflective film, the low-reflectance wavelength range is 78 nm.

In the conventional semiconductor optical device, the above-mentioned three kinds of films are used as the nonreflective film of the semiconductor laser as an example of the semiconductor optical element. When the total thickness of the three films (the total sum of products of thicknesses and refractive indices of respective layers) is an integer multiple of $\lambda/4$ other than $\lambda/4$, however, the low-reflectance wavelength range becomes extremely narrow. More specifically, it is difficult to make the low-reflectance wavelength range equal to or wider than 100 nm. Therefore, in the conventional semiconductor optical device disclosed in Japanese Patent Laying-Open No. 2001-196685, the total film thickness must be equal to $\lambda/4$.

Therefore, as means to solve the above-described problem caused with the conventional semiconductor optical device disclosed in Japanese Patent Laying-Open No. 2001-196685, the inventors of the present invention have been studying forming a nonreflective film by a design procedure in which a real part and an imaginary part of an amplitude reflectance of two films having different compositions are respectively brought to zero, as an unpublished technique as of the application for patenting of the present invention. With this design procedure, the total film thickness of two films having different compositions can be made different from $\lambda/4$.

In this design procedure, however, the degree of freedom in a design of a nonreflective film of a semiconductor optical device cannot be enhanced because only two kinds of films form the nonreflective film. With this design procedure, for example, it is impossible to provide a film for efficient heat radiation by a semiconductor laser as a third film in addition to the two films respectively bringing the real part and imaginary part of the amplitude reflectance to zero.

SUMMARY OF THE INVENTION

An object of the present invention is to provide a semiconductor optical device which can enhance a degree of freedom in a design of a nonreflective film even when a total film thickness of a plurality of films is different from a value $\lambda/4$, and to provide a semiconductor laser module using the semiconductor optical device.

A semiconductor optical device according to the present invention includes a semiconductor optical element and a nonreflective film receiving light emitted from the semiconductor optical element and making incident light interfere with reflected light for light of a certain wavelength to bring a reflectance of the light to substantially zero.

In addition, the nonreflective film is formed with a plurality of films each having a refractive index higher than 1 and are formed with a high-refractive index film having a refractive index higher than a square root of an effective refractive index of the semiconductor optical element and a low-refractive index film having a refractive index lower than a square root of an effective refractive index of the semiconductor optical element.

In addition, while each of the plurality of films is formed with a single composition, the plurality of films are formed with equal to or more than three kinds of compositions, and are formed such that, a real part and an imaginary part of an amplitude reflectance are respectively brought to zero as a whole.

With the above-described structure, a design procedure can be used wherein thicknesses of respective two specific kinds of films are determined such that a real part and an imaginary part of an amplitude reflectance of a plurality of films are respectively brought to zero as a whole, using a film of the plurality of films formed with equal to or more than three kinds of film compositions, which film is the aforementioned two specific kinds of films having known refractive indices and unknown thicknesses, and a film having known thickness and refractive index.

With this design procedure, a degree of freedom in a design of the nonreflective film is enhanced as compared with the procedure previously studied by the inventors of the present invention, wherein the nonreflective film is formed with two kinds of films, and is designed such that a real part and an imaginary part of an amplitude reflectance of the two films are respectively brought to zero.

A semiconductor laser module according to the present invention uses the semiconductor optical device including a semiconductor laser as the aforementioned semiconductor optical element. The semiconductor laser module includes a first reflective film having a higher reflectance than that of the nonreflective film and provided outside the semiconductor device, and a second reflective film provided on an end surface of the semiconductor device different from that end surface on which the nonreflective film is provided and having a higher reflectance than that of the nonreflective film for light of a prescribed wavelength.

In addition, light of a specific wavelength reflected from the first reflective film and the second reflective film passes through the nonreflective film. With this, the light oscillates between the first reflective film and the second reflective film.

With the above-described structure, an oscillation determined with a gain of the semiconductor laser itself and a reflectance of the nonreflective film can be suppressed utilizing the nonreflective film having a wider low-reflectance wavelength range than that of the conventional nonreflective film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Semiconductor optical devices of embodiments of the present invention will be described in the following based on the drawings.

First Embodiment

A description of "a nonreflective film having a two-layer structure which becomes nonreflective at a specific wavelength λ", which is a base of a semiconductor optical device of this embodiment, will now be given.

Figure 1:
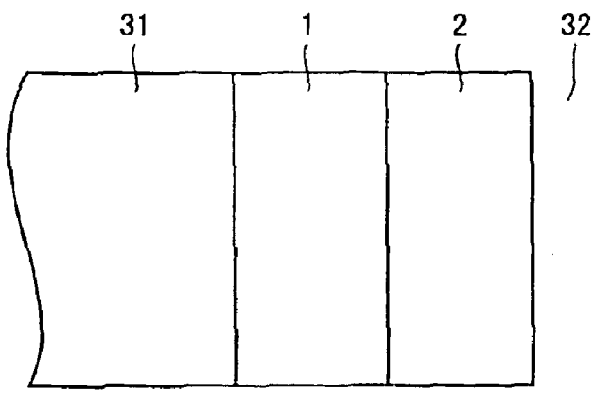
FIG. 1 shows a nonreflective film according to the present invention having a two-layer structure and having a reflectance which is brought to zero at a wavelength λ.

In a nonreflective film having a two-layer structure shown in FIG. 1, a two-layer structure film formed with a first film 1 having a refractive index $n_1$ and a thickness $d_1$ and a second film 2 having a refractive index $n_2$ and a thickness $d_2$, and a semiconductor laser 31 having an effective refractive index $n_c$ are provided in space 32 of air, nitrogen or the like which has a refractive index of 1.

Assuming that a wavelength of light is $\lambda$ and unknown phases of first film 1 and second film 2 are $\phi_1$ and $\phi_2$, respectively, the following equations (1a), (1b) are formulated.

$$\phi_1 = \frac{2\pi}{\lambda} n_1 d_1 \tag{1a}$$

$$\phi_2 = \frac{2\pi}{\lambda} n_2 d_2 \tag{1b}$$

Herein, an amplitude reflectance r is expressed as the following equation (2).

$$r = \frac{(n_c - 1)\cos\phi_1\cos\phi_2 + \left(\frac{n_1}{n_2} - \frac{n_2 n_c}{n_1}\right)\sin\phi_1\sin\phi_2 - i\left\{\left(\frac{n_c}{n_2} - n_2\right)\cos\phi_1\sin\phi_2 + \left(\frac{n_c}{n_1} - n_1\right)\sin\phi_1\cos\phi_2\right\}}{(n_c + 1)\cos\phi_1\cos\phi_2 - \left(\frac{n_2 n_c}{n_1} + \frac{n_1}{n_2}\right)\sin\phi_1\sin\phi_2 - i\left\{\left(\frac{n_c}{n_2} + n_2\right)\cos\phi_1\sin\phi_2 + \left(\frac{n_c}{n_1} + n_1\right)\sin\phi_1\cos\phi_2\right\}} \tag{2}$$

Respective thicknesses $d_1$ and $d_2$ of first film 1 and second film 2, which are unknown values, are calculated for a situation when a real part and an imaginary part of amplitude reflectance r are respectively brought to zero. Inversely speaking, the film of the two-layer structure having first film 1 and second film 2 respectively having the calculated thicknesses $d_1$ and $d_2$ is a nonreflective film having an amplitude reflectance of zero.

In addition, a power reflectance R is expressed as $|r|^2$. Herein, power reflectance R is brought to zero when the following equations (3a), (3b) are satisfied.

$$n_c - 1 + (n_1/n_2 - n_2 n_c/n_1)\tan\phi_1\tan\phi_2 = 0 \tag{3a}$$

$$(n_c/n_1 - n_1)\tan\phi_1 + (n_c/n_2 - n_2)\tan\phi_2 = 0 \tag{3b}$$

Assuming that, for example, effective refractive index $n_c$ of semiconductor laser 31 is $n_c$=3.37, first film 1 is $Ta_2O_5$ ($n_2$=2.057), second film 2 is $Al_2O_3$ ($n_1$=1.62), and a wavelength of light is 980 nm, then the real part and imaginary part of the amplitude reflectance of the two-layer structure film formed with first film 1 and second film 2 are respectively brought to zero when thickness $d_1$ of first film 1 and thickness $d_2$ of second film 2 are 71.34 nm and 86.20 nm, respectively.

Figure 2:
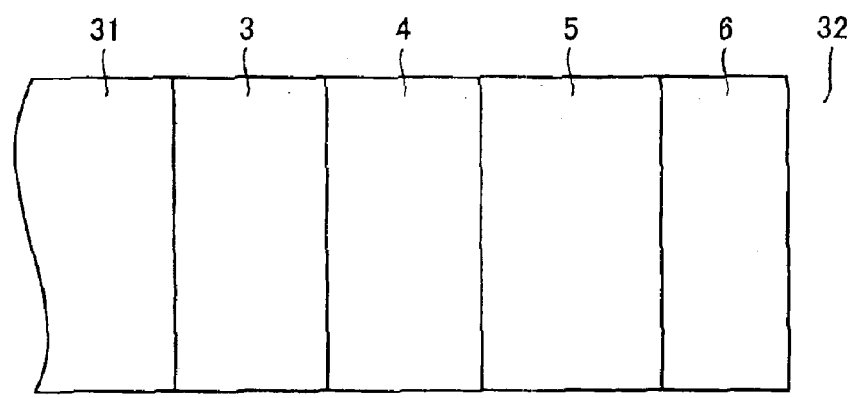
FIG. 2 shows a nonreflective film according to the present invention having a four-layer structure and having a reflectance which is brought to zero at a wavelength λ.

A nonreflective film of a four-layer structure, which is formed by doubling the aforementioned two-layer structure nonreflective film formed with first film 1 and second film 2, will now be described. As shown in FIG. 2, semiconductor laser 31 having effective refractive index $n_c$ and a nonreflective film of a four-layer structure are provided in space 32 of air, nitrogen or the like which has a refractive index of 1.

The nonreflective film of the four-layer structure is formed with a first film 3 having refractive index $n_1$ and a thickness $Ad_1$, a second film 4 having refractive index $n_2$ and a thickness $Ad_2$, a third film 5 having refractive index $n_1$ and a thickness $Bd_1$, and a fourth film 6 having refractive index $n_2$ and a thickness $Bd_2$.

The above-mentioned values A and B are prescribed parameters. A similar procedure as described with the two-layer structure nonreflective film can be used to calculate a thickness of each film of the four-layer structure nonreflective film when the real part and imaginary part of the amplitude reflectance of the four-layer structure nonreflective film are respectively brought to zero. That is, thicknesses $d_1$ and $d_2$ when the real part and imaginary part of amplitude reflectance r are respectively brought to zero are calculated using the following equations (3c), (3d).

$$r = \frac{(m_{11} + m_{12})n_c - (m_{21} + m_{22})}{(m_{11} + m_{12})n_c + (m_{21} + m_{22})} \tag{3c}$$

Herein, $$\begin{pmatrix} m_{11} & m_{12} \\ m_{21} & m_{22} \end{pmatrix} = \tag{3d}$$

$$\begin{pmatrix} \cos A\phi_1 & -\frac{i}{n_1}\sin A\phi_1 \\ -in_1\sin A\phi_1 & \cos A\phi_1 \end{pmatrix} \times \begin{pmatrix} \cos A\phi_2 & -\frac{i}{n_2}\sin A\phi_2 \\ -in_2\sin A\phi_2 & \cos A\phi_2 \end{pmatrix} \times$$

$$\begin{pmatrix} \cos B\phi_1 & -\frac{i}{n_1}\sin B\phi_1 \\ -in_1\sin B\phi_1 & \cos B\phi_1 \end{pmatrix} \times \begin{pmatrix} \cos B\phi_2 & -\frac{i}{n_2}\sin B\phi_2 \\ -in_2\sin B\phi_2 & \cos B\phi_2 \end{pmatrix}$$

It is assumed that, for example, effective refractive index $n_c$ of the semiconductor laser is $n_c$=3.37. In addition, it is assumed that first film 3 and third film 5 are respectively formed with $Al_2O_3$ ($n_1$=1.62), and second film 4 and fourth film 6 are respectively formed with $Ta_2O_5$ ($n_2$=2.057).

Furthermore, a wavelength of light is assumed to be 980 nm and, for example, the parameters are assumed to be A=1.2 and B=0.8. Amplitude reflectance r of the four-layer structure nonreflective film is brought to zero when thickness $d_1$ of first and third films and thickness $d_2$ of second and fourth films, which are unknown values, are 36.20 nm and 27.17 nm, respectively.

A nonreflective film, which is formed by adding another material having a refractive index $n_3$ and a film thickness $d_3$ to the above-described two-layer structure, will now be described. In a design of this nonreflective film, a value of thickness $d_3$ of another film is previously given. That is, a phase $\phi_3$ of another material, which is expressed as equations (4), (5) shown below, is handled as a known value in the design of this nonreflective film.

Respective phases $\phi_1$ and $\phi_2$ of the first and second films are unknown values. For the nonreflective film formed by adding another material to the two-layer structure, thicknesses $d_1$ and $d_2$ are also calculated with a procedure similar to the design procedure of the aforementioned two-layer structure nonreflective film, that is, by respectively bringing the real part and imaginary part of amplitude reflectance r to zero.

Therefore, specific kind of another film having known refractive index and thickness is added to the specific two kinds of films having known refractive indices and unknown thicknesses, and the thicknesses of the specific two kinds of films forming the nonreflective film which brings amplitude reflectance r to about zero for specific wavelength $\lambda$ are determined.

$$\phi_3 = \frac{2\pi}{\lambda} n_3 d_3 \tag{4}$$

$$\begin{pmatrix} m_{11} & m_{12} \\ m_{21} & m_{22} \end{pmatrix} = \begin{pmatrix} \cos A\phi_1 & -\dfrac{i}{n_1}\sin A\phi_1 \\ -in_1 \sin A\phi_1 & \cos A\phi_1 \end{pmatrix} \times \\ \begin{pmatrix} \cos A\phi_2 & -\dfrac{i}{n_2}\sin A\phi_2 \\ -in_2 \sin A\phi_2 & \cos A\phi_2 \end{pmatrix} \times \begin{pmatrix} \cos\phi_3 & -\dfrac{i}{n_3}\sin\phi_3 \\ -in_3\sin\phi_3 & \cos\phi_3 \end{pmatrix} \quad (5)$$

In a design procedure of a five-layer structure nonreflective film, an equation (6) is used. Thicknesses $d_1$ and $d_2$ are similarly calculated using equation (6) so as to respectively bring the real part and imaginary part of amplitude reflectance r expressed with equation (3c) to zero.

Therefore, a specific kind of film having known refractive index and thickness is added to the four-layer structure formed by doubling the specific two kinds of films having known refractive indices and unknown thicknesses, and the thicknesses of the specific two kinds of films forming the nonreflective film which brings the amplitude reflectance to about zero for specific wavelength λ are determined.

$$\begin{pmatrix} m_{11} & m_{12} \\ m_{21} & m_{22} \end{pmatrix} = \begin{pmatrix} \cos A\phi_1 & -\dfrac{i}{n_1}\sin A\phi_1 \\ -in_1 \sin A\phi_1 & \cos A\phi_1 \end{pmatrix} \times \\ \begin{pmatrix} \cos A\phi_2 & -\dfrac{i}{n_2}\sin A\phi_2 \\ -in_2 \sin A\phi_2 & \cos A\phi_2 \end{pmatrix} \times \begin{pmatrix} \cos B\phi_1 & -\dfrac{i}{n_1}\sin B\phi_1 \\ -in_1 \sin B\phi_1 & \cos B\phi_1 \end{pmatrix} \times \\ \begin{pmatrix} \cos B\phi_2 & -\dfrac{i}{n_2}\sin B\phi_2 \\ -in_2\sin B\phi_2 & \cos B\phi_2 \end{pmatrix} \times \begin{pmatrix} \cos\phi_3 & -\dfrac{i}{n_3}\sin\phi_3 \\ -in_3\sin\phi_3 & \cos\phi_3 \end{pmatrix} \quad (6)$$

In a design procedure of a seven-layer structure nonreflective film, an equation (7) is used. Thicknesses $d_1$ and $d_2$ are similarly calculated using equation (7) so as to respectively bring the real part and imaginary part of amplitude reflectance r expressed with equation (3c) to zero.

Therefore, a specific kind of film having known refractive index and thickness is added to a six-layer structure formed by tripling the specific two kinds of films having known refractive indices and unknown thicknesses, and the thicknesses of the specific two kinds of films forming the nonreflective film which brings the amplitude reflectance to about zero for specific wavelength λ are determined.

$$\begin{pmatrix} m_{11} & m_{12} \\ m_{21} & m_{22} \end{pmatrix} = \begin{pmatrix} \cos A\phi_1 & -\dfrac{i}{n_1}\sin A\phi_1 \\ -in_1 \sin A\phi_1 & \cos A\phi_1 \end{pmatrix} \times \\ \begin{pmatrix} \cos A\phi_2 & -\dfrac{i}{n_2}\sin A\phi_2 \\ -in_2 \sin A\phi_2 & \cos A\phi_2 \end{pmatrix} \times \begin{pmatrix} \cos B\phi_1 & -\dfrac{i}{n_1}\sin B\phi_1 \\ -in_1 \sin B\phi_1 & \cos B\phi_1 \end{pmatrix} \times \\ \begin{pmatrix} \cos B\phi_2 & -\dfrac{i}{n_2}\sin B\phi_2 \\ -in_2\sin B\phi_2 & \cos B\phi_2 \end{pmatrix} \times \begin{pmatrix} \cos C\phi_1 & -\dfrac{i}{n_1}\sin C\phi_1 \\ -in_1\sin C\phi_1 & \cos C\phi_1 \end{pmatrix} \times \\ \begin{pmatrix} \cos C\phi_2 & -\dfrac{i}{n_2}\sin C\phi_2 \\ -in_2\sin C\phi_2 & \cos C\phi_2 \end{pmatrix} \times \begin{pmatrix} \cos\phi_3 & -\dfrac{i}{n_3}\sin\phi_3 \\ -in_3\sin\phi_3 & \cos\phi_3 \end{pmatrix} \quad (7)$$

A semiconductor optical device having the seven-layer structure nonreflective film according to this embodiment will now be described.

Figure 3:
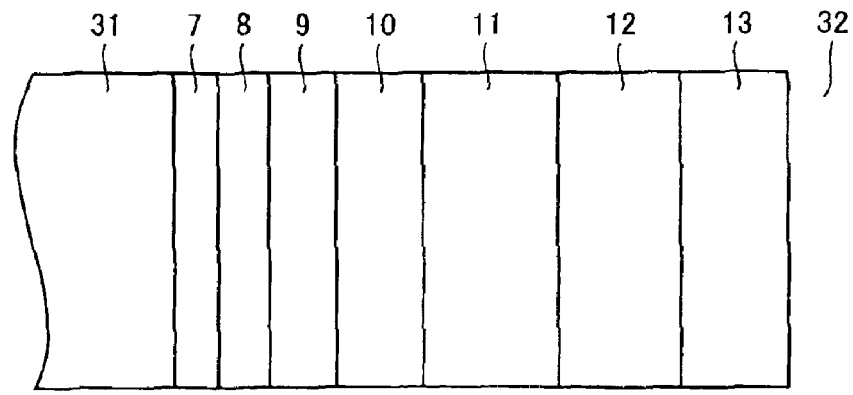
FIG. 3 shows a nonreflective film of a semiconductor laser in a first embodiment.

As shown in FIG. 3, the semiconductor optical device having the seven-layer structure in this embodiment is formed such that, semiconductor laser 31 and the nonreflective film formed by adding a specific kind of film having known refractive index and thickness to the six-layer structure formed by tripling the specific two kinds of films having known refractive indices and unknown thicknesses are provided in space 32 of air, nitrogen or the like which has a refractive index of 1.

The nonreflective film is formed with the six-layer structure of a first film 7 of tantalum oxide ($Ta_2O_5$) (refractive index $n_1$=2.057, thickness=$Ad_1$), a second film 8 of alumina ($Al_2O_3$) (refractive index $n_2$=1.62, thickness=$Ad_2$), a third film 9 of tantalum oxide ($Ta_2O_5$) (refractive index $n_1$=2.057, thickness=$Bd_1$), a fourth film 10 of alumina ($Al_2O_3$) (refractive index $n_2$=1.62, thickness=$Bd_2$), a fifth film 11 of tantalum oxide ($Ta_2O_5$) (refractive index $n_1$=2.057, thickness=$Cd_1$), and a sixth film 12 of alumina ($Al_2O_3$) (refractive index $n_2$=1.62, thickness=$Cd_2$), and a seventh film 13 of silicon oxide ($SiO_2$) (refractive index $n_3$=1.45, thickness $d_3$=50 nm). Algebraic symbols A, B and C in the equations expressing the thicknesses represent aforementioned prescribed parameters.

According to the above-described seven-layer structure nonreflective film, the real part and imaginary part of amplitude reflectance r of the nonreflective film can respectively be brought to zero at wavelength λ=980 nm when A=2.85, B=2.0 and C=2.0, and when phases $\phi_1$ and $\phi_2$ of tantalum oxide and alumina are 0.485352 and 0.872841, respectively.

Herein, the thickness of each film will be as follows. First film/second film/third film/fourth film/fifth film/sixth film/seventh film=$Ad_1$/$Ad_2$/$Bd_1$/$Bd_2$/$Cd_1$/$Cd_2$/$d_3$=104.89 nm/239.50 nm/73.60 nm/168.07 nm/73.60 nm/168.07 nm/50 nm.

Thus, the total film thickness, which is the total sum of products of thicknesses and refractive indices of respective layers, is 1523.59 nm. This value is about 6.2 times larger than a film thickness 245 nm which is a quarter of the wavelength of light λ. The total film thickness is therefore much larger than that of the conventional semiconductor optical device.

Figure 4:
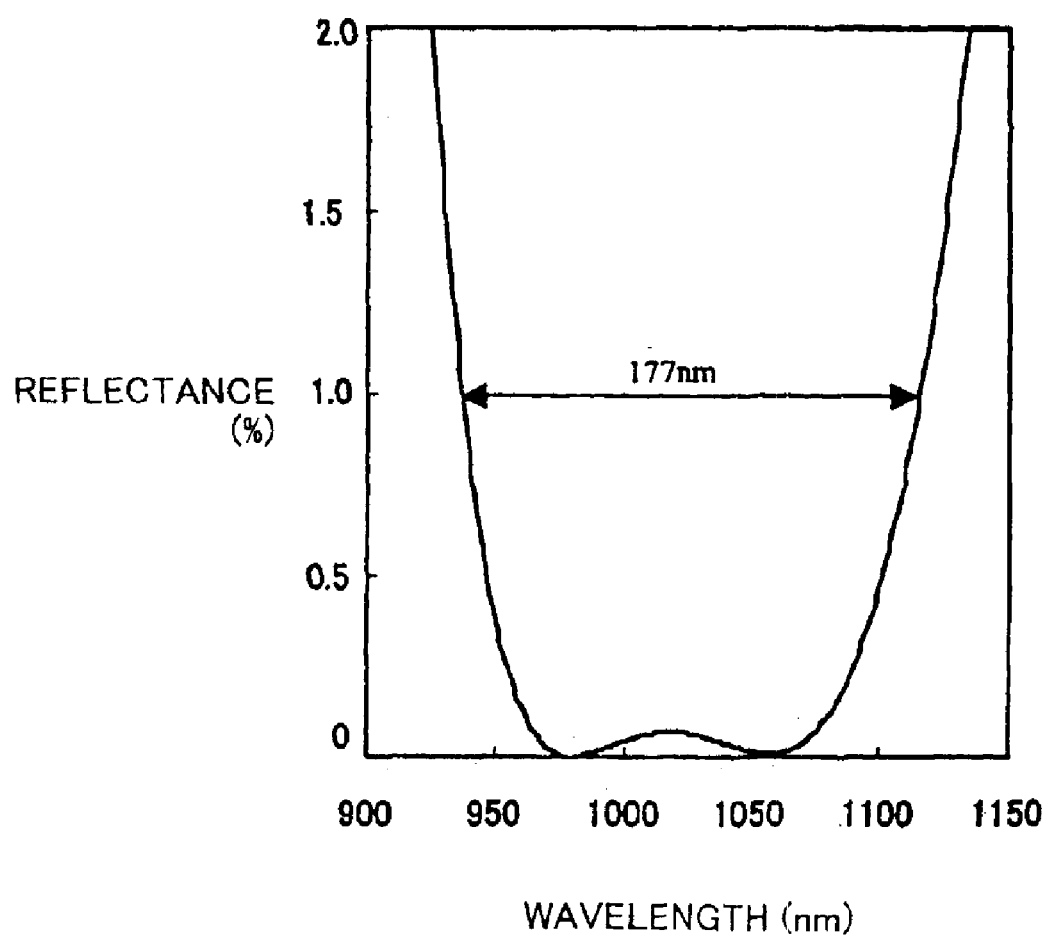
FIG. 4 shows wavelength dependence of a reflectance of the nonreflective film of the semiconductor laser of the first embodiment.

In this situation, wavelength dependence of the reflectance of the nonreflective film is similar to a bathtub curve, as shown in FIG. 4. In addition, a low-reflectance wavelength range of the nonreflective film is 177 nm. Thus, the low-reflectance wavelength range of the nonreflective film in this embodiment is much wider than that of the conventional nonreflective film.

As described below, when a semiconductor laser and a fiber grating are combined, it is desirable to set desired wavelength λ (980 nm, for example) as the center of the bathtub curve of a reflectance distribution.

In this situation, it is preferable to set phases $\phi_1$ and $\phi_2$ of tantalum oxide and alumina to 0.488994 and 0.859283, respectively, and to design the nonreflective film so as to bring the reflectance to zero at wavelength λ=940 nm.

Herein, the thickness of each film is as follows. First film/second film/third film/fourth film/fifth film/sixth film/seventh film=$Ad_1$/$Ad_2$/$Bd_1$/$Bd_2$/$Cd_1$/$Cd_2$/$d_3$=101.36 nm/226.16 nm/71.13 nm/158.71 nm/71.13 nm/158.71 nm/50 nm.

Figure 5:
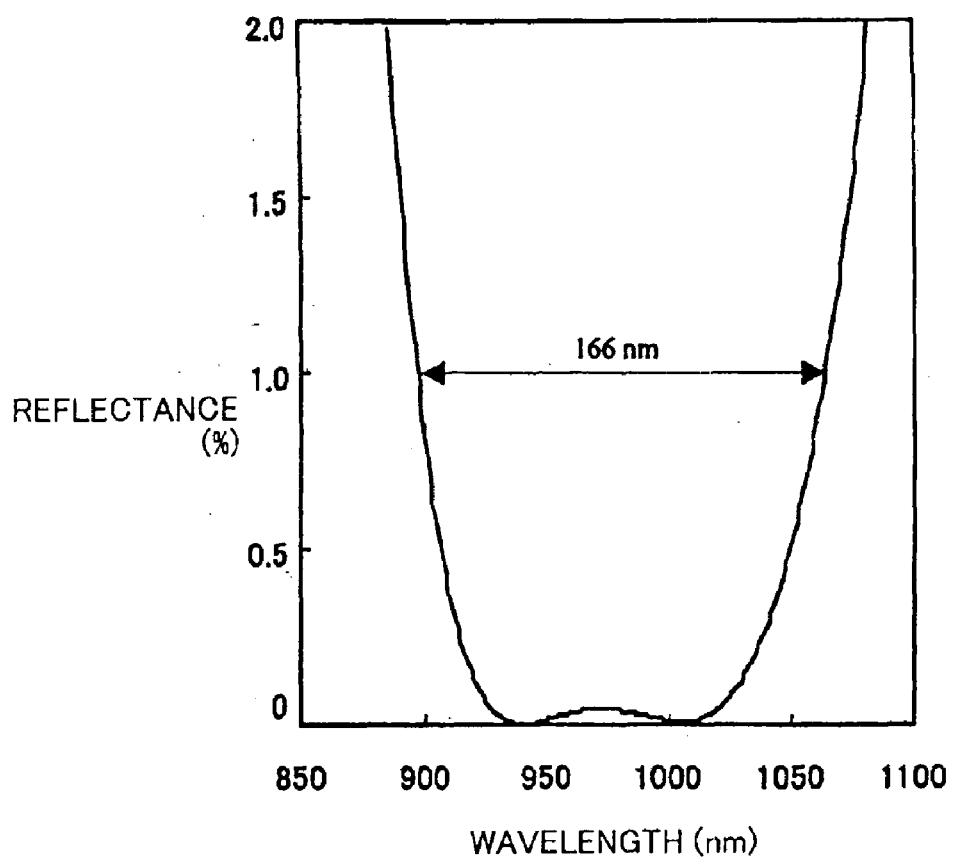
FIG. 5 shows wavelength dependence of a reflectance of a nonreflective film of a semiconductor laser in another example of the first embodiment.

FIG. 5 shows wavelength dependence of the reflectance of the nonreflective film when desired wavelength λ (980 nm, for example) is set as the center of the bathtub curve of the reflectance distribution. A low-reflectance wavelength range of the nonreflective film is 166 nm. Thus, the low-reflectance wavelength range of this nonreflective film is much wider than that of the conventional nonreflective film.

Second Embodiment

A semiconductor optical device of a second embodiment will now be described with reference to FIGS. 6–8.

The semiconductor optical device of this embodiment is formed such that, semiconductor laser 31 and a nonreflective film formed by adding a specific kind of film having known refractive index and thickness to a six-layer structure formed by tripling specific two kinds of films having known refractive indices and unknown thicknesses are provided in space 32 of air, nitrogen or the like which has a refractive index of 1.

Figure 6:
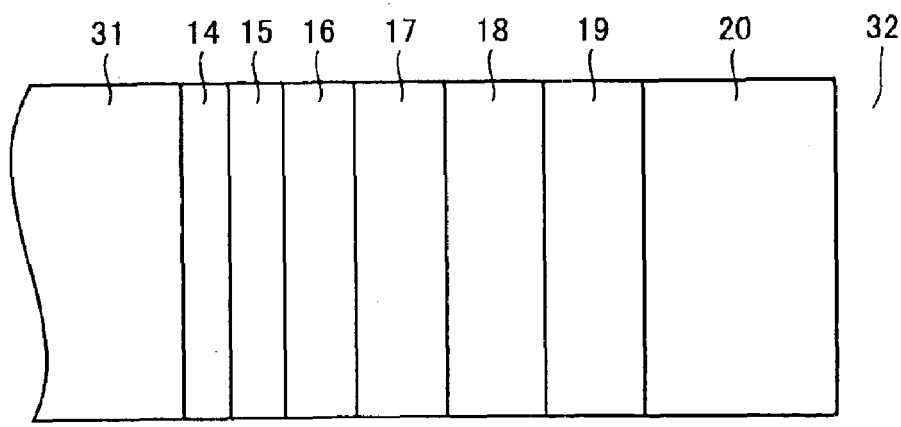
FIG. 6 shows a nonreflective film of a semiconductor laser in a second embodiment.

In addition, as shown in FIG. 6, the nonreflective film includes a first film 14 of tantalum oxide ($Ta_2O_5$) (refractive index $n_1$=2.057, thickness=$Ad_1$), a second film 15 of alumina ($Al_2O_3$) (refractive index $n_2$=1.62, thickness=$Ad_2$), a third film 16 of tantalum oxide ($Ta_2O_5$) (refractive index $n_1$=2.057, thickness=$Bd_1$), a fourth film 17 of alumina ($Al_2O_3$) (refractive index $n_2$=1.62, thickness=$Bd_2$), a fifth film 18 of tantalum oxide ($Ta_2O_5$) (refractive index $n_1$=2.057, thickness=$Cd_1$), a sixth film 19 of alumina ($Al_2O_3$) (refractive index $n_2$=1.62, thickness=$Cd_2$), and a seventh film 20 of aluminum nitride (AlN) (refractive index $n_3$=2.072, thickness $d_3$=50 nm). Algebraic symbols A, B and C in the equations expressing the thicknesses represent prescribed parameters.

According to the above-described structure, the real part and imaginary part of the amplitude reflectance of the nonreflective film can respectively be brought to zero at wavelength $\lambda$=980 nm when A=2.7, B=3.0 and C=2.0, and when phases $\phi_1$ and $\phi_2$ of tantalum oxide and alumina are 0.671597 and 0.482534, respectively.

Herein, the thickness of each film is as follows. First film/second film/third film/fourth film/fifth film/sixth film/seventh film=$Ad_1$/$Ad_2$/$Bd_1$/$Bd_2$/$Cd_1$/$Cd_2$/$d_3$=137.49 nm/125.44 nm/152.77 nm/139.37 nm/101.85 nm/92.92 nm/50 nm. Thus, the total film thickness is 1489.7 nm. This value is about 6.1 times larger than a value 245 nm corresponding to $\lambda$/4. The film thickness is therefore much larger than that of the conventional semiconductor optical device.

Figure 7:
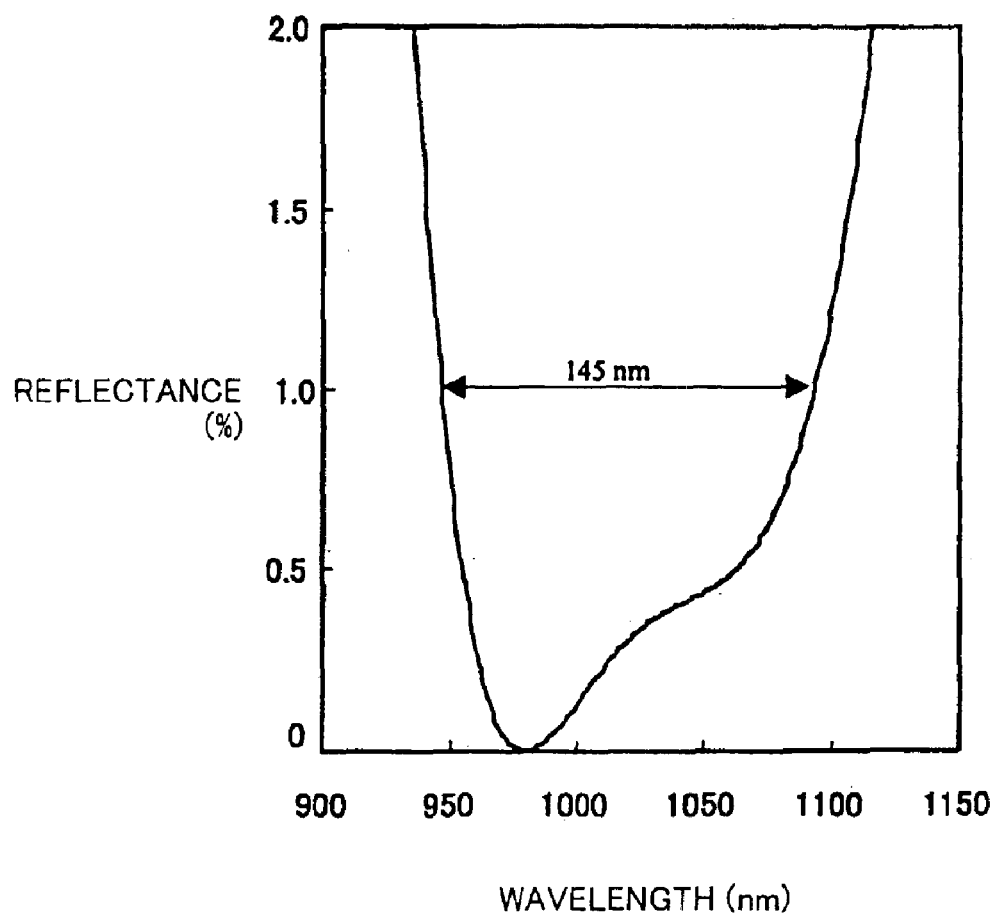
FIG. 7 shows wavelength dependence of a reflectance of the nonreflective film of the semiconductor laser of the second embodiment.

In this situation, wavelength dependence of the reflectance of the nonreflective film is similar to a bathtub curve, as shown in FIG. 7. In addition, a low-reflectance wavelength range of the nonreflective film is 145 nm. Thus, the low-reflectance wavelength range of the nonreflective film in this embodiment is much wider than that of the conventional nonreflective film.

In addition, when desired wavelength $\lambda$=980 nm is set as the center of the bathtub curve of the reflectance distribution, it is preferable to set phases $\phi_1$ and $\phi_2$ of tantalum oxide and alumina to 0.685788 and 0.470145, respectively, and to design the nonreflective film so as to bring the reflectance to zero at wavelength $\lambda$ of 938 nm.

Herein, the thickness of each film is as follows. First film/second film/third film/fourth film/fifth film/sixth film/seventh film=$Ad_1$/$Ad_2$/$Bd_1$/$Bd_2$/$Cd_1$/$Cd_2$/$d_3$=134.38 nm/116.98 nm/149.31 nm/129.88 nm/99.54 nm/86.65 nm/50 nm.

Figure 8:
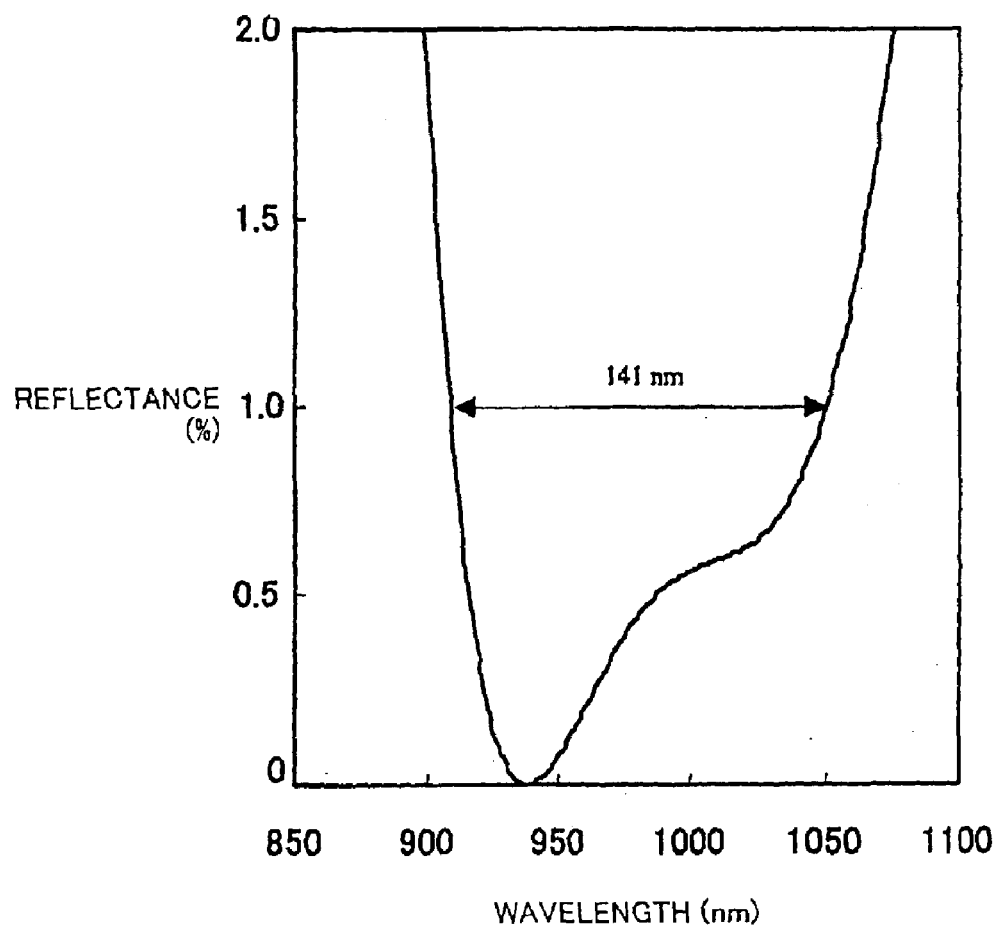
FIG. 8 shows wavelength dependence of a reflectance of a nonreflective film of a semiconductor laser in another example of the second embodiment.

FIG. 8 shows wavelength dependence of the reflectance of the above-described nonreflective film. A low-reflectance wavelength range of this nonreflective film is 141 nm. Thus, the low-reflectance wavelength range of this nonreflective film is much wider than that of the conventional nonreflective film.

Third Embodiment

A semiconductor optical device of a third embodiment will now be described with reference to FIGS. 9–14.

Figure 9:
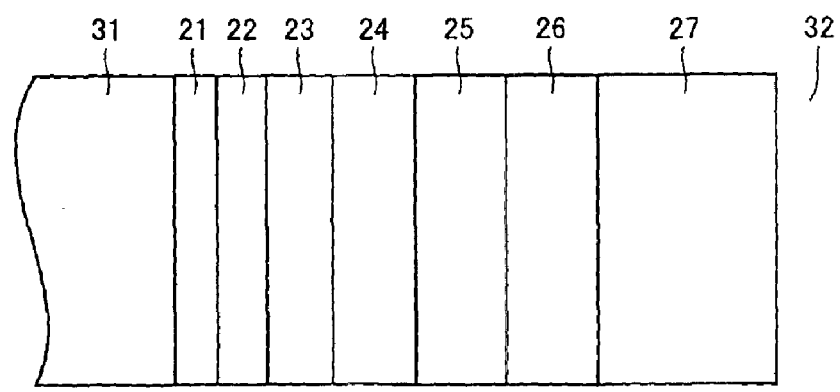
FIG. 9 shows a nonreflective film of a semiconductor laser in a third embodiment.

As shown in FIG. 9, the semiconductor optical device of this embodiment is formed such that, semiconductor laser 31 and a nonreflective film formed by adding a specific kind of film having known refractive index and thickness to a six-layer structure formed by tripling specific two kinds of films having known refractive indices and unknown thicknesses are provided in space 32 of air, nitrogen or the like which has a refractive index of 1.

In addition, the nonreflective film includes a first film 21 of aluminum nitride (AlN) (refractive index $n_3$=2.072, thickness $d_3$=50 nm), a second film 22 of tantalum oxide ($Ta_2O_5$) (refractive index $n_1$=2.057, thickness=$Ad_1$), a third film 23 of alumina ($Al_2O_3$) (refractive index $n_2$=1.62, thickness=$Ad_2$), a fourth film 24 of tantalum oxide ($Ta_2O_5$) (refractive index $n_1$=2.057, thickness=$Bd_1$), a fifth film 25 of alumina ($Al_2O_3$) (refractive index $n_2$=1.62, thickness=$Bd_2$), a sixth film 26 of tantalum oxide ($Ta_2O_5$) (refractive index $n_1$=2.057, thickness=$Cd_1$), and a seventh film 27 of alumina ($Al_2O_3$) (refractive index $n_2$=1.62, thickness=$Cd_2$). The thickness of aluminum nitride (AlN) forming first film 21 is 50 nm.

Three kinds of materials, that is, aluminum nitride, tantalum oxide and alumina are used in the nonreflective film of this embodiment. The thermal conductivity of aluminum nitride is about 1.8 W/cm/° C. The thermal conductivity of tantalum oxide is about 0.1 W/cm/° C. The thermal conductivity of alumina is about 0.2 W/cm/° C. Therefore, aluminum nitride has the highest thermal conductivity in the three materials.

In addition, the real part and imaginary part of the amplitude reflectance of the nonreflective film are respectively brought to zero at wavelength $\lambda$=980 nm when A=2.0, B=2.0 and C=2.0, and when phases $\phi_1$ and $\phi_2$ of tantalum oxide and alumina are 0.449531 and 0.991758, respectively. Herein, the thickness of each film is as follows. First film/second film/third film/fourth film/fifth film/sixth film/seventh film=$d_3$/$Ad_1$/$Ad_2$/$Bd_1$/$Bd_2$/$Cd_1$/$Cd_2$=50 nm/68.17 nm/190.97 nm/68.17 nm/190.97 nm/68.17 nm/190.97 nm.

Figure 10:
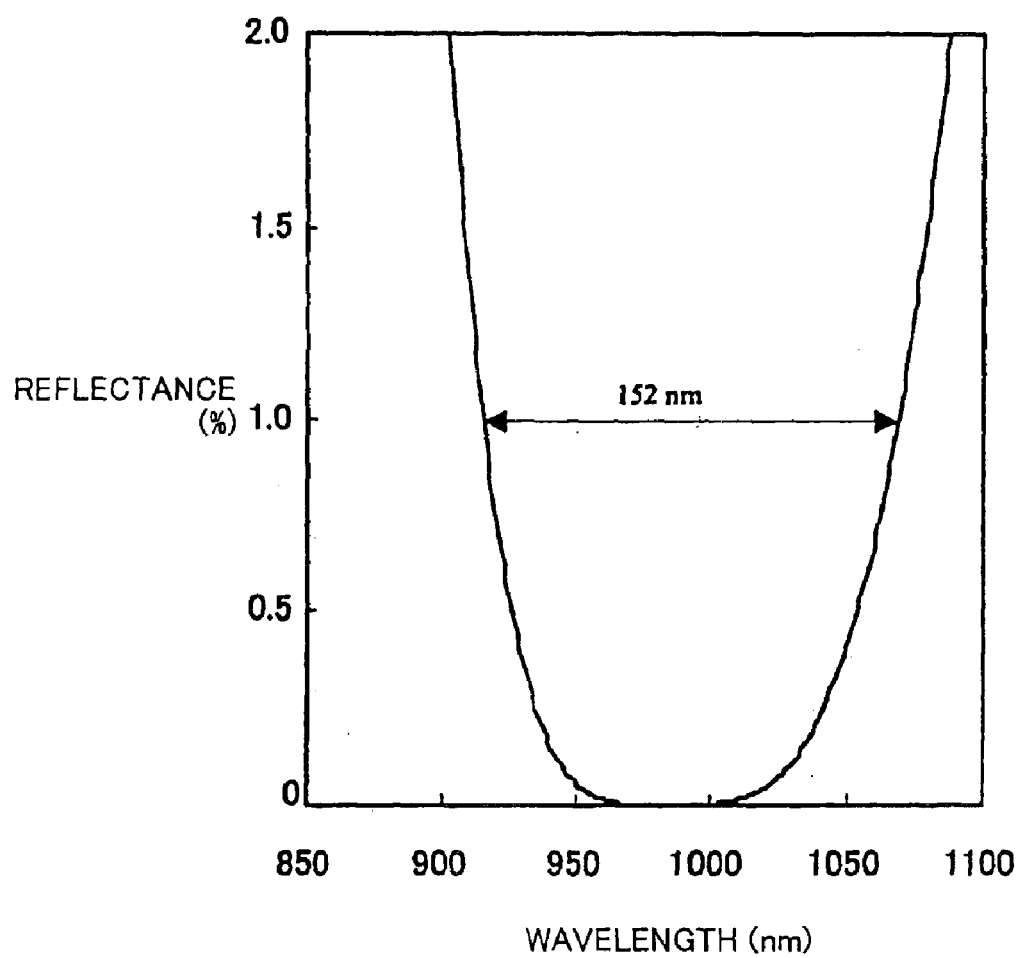
FIG. 10 shows wavelength dependence of a reflectance of the nonreflective film of the semiconductor laser of the third embodiment.

Thus, the total film thickness is 1452.26 nm. The total film thickness is about 5.9 times larger than a value 245 nm corresponding to a quarter of wavelength $\lambda$. The wavelength dependence of the reflectance of this nonreflective film is similar to a bathtub curve, as shown in FIG. 10. In addition, a low-reflectance wavelength range of the nonreflective film is 152 nm.

When desired wavelength $\lambda$=980 nm is set as the center of the bathtub curve of the reflectance distribution, it is preferable to set phases $\phi_1$ and $\phi_2$ of tantalum oxide and alumina to 0.449325 and 1.00016, respectively, and to design the nonreflective film so as to respectively bring the real part and imaginary part of the amplitude reflectance of the nonreflective film to zero at wavelength $\lambda$=962 nm.

Herein, the thickness of each film is as follows. First film/second film/third film/fourth film/fifth film/sixth film/seventh film=$d_3$/$Ad_1$/$Ad_2$/$Bd_1$/$Bd_2$/$Cd_1$/$Cd_2$=50 nm/55.89 nm/189.05 nm/66.89 nm/189.05 nm/66.89 nm/189.05 nm.

Figure 11:
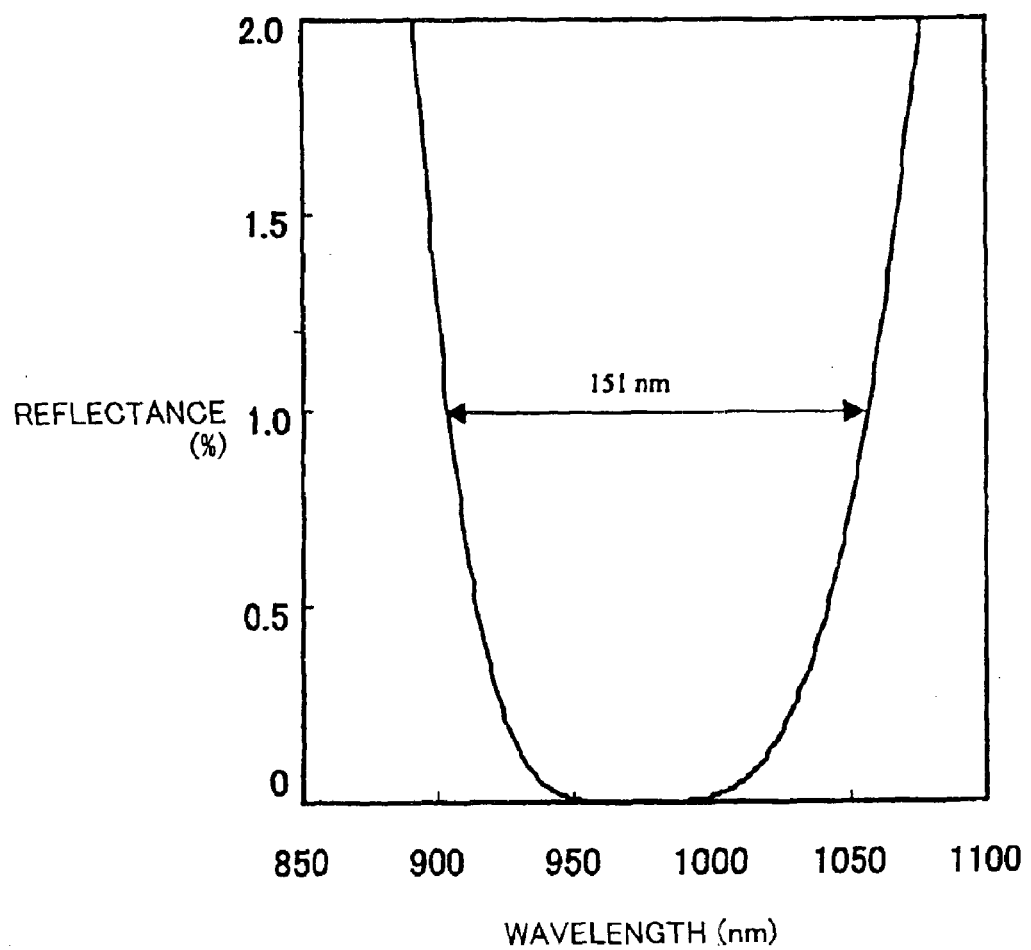
FIG. 11 shows wavelength dependence of a reflectance of a nonreflective film of a semiconductor laser in another example of the third embodiment.

FIG. 11 shows wavelength dependence of the reflectance of this nonreflective film. A low-reflectance wavelength range of this nonreflective film is 151 nm.

Figure 12:
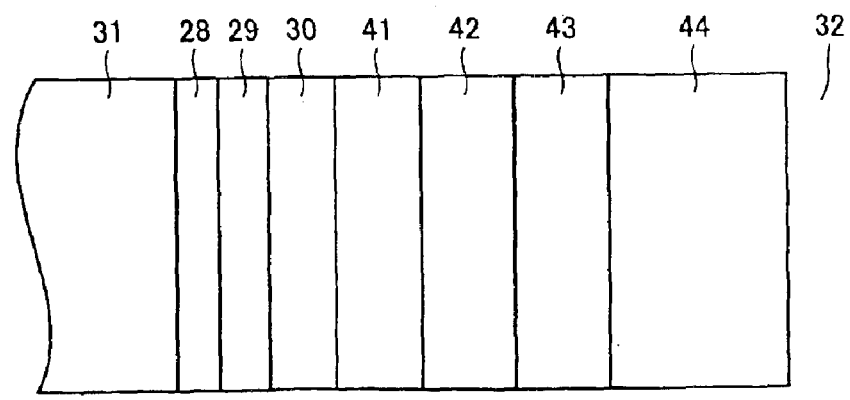
FIG. 12 shows a nonreflective film of a semiconductor laser in a further example of the third embodiment.

FIG. 12 shows a nonreflective film including a first film of aluminum ntride (AlN) having a thickness of 120 nm.

In FIG. 12, the nonreflective film includes a first film 28 of aluminum nitride (AlN) (refractive index $n_3$=2.072, thickness $d_3$=120 nm), a second film 29 of tantalum oxide ($Ta_2O_5$) (refractive index $n_1$=2.057, thickness=$Ad_1$), a third film 30 of alumina ($Al_2O_3$) (refractive index $n_2$=1.62, thickness=$Ad_2$), a fourth film 41 of tantalum oxide ($Ta_2O_5$) (refractive index $n_1$=2.057, thickness=$Bd_1$), a fifth film 42 of alumina ($Al_2O_3$) (refractive index $n_2$=1.62, thickness=$Bd_2$), a sixth film 43 of tantalum oxide ($Ta_2O_5$) (refractive index $n_1=2.057$, thickness=$Cd_1$), and a seventh film 44 of alumina ($Al_2O_3$) (refractive index $n_2=1.62$, thickness=$Cd_2$).

In addition, the real part and imaginary part of the amplitude reflectance of the nonreflective film are respectively brought to zero at wavelength $\lambda=980$ nm when A=0.9, B=2.0 and C=2.0, and when phases $\phi_1$ and $\phi_2$ of tantalum oxide and alumina are 0.726468 and 0.860316, respectively.

Herein, the thickness of each film is as follows. First film/second film/third film/fourth film/fifth film/sixth film/seventh film=$d_3$/$Ad_1$/$Ad_2$/$Bd_1$/$Bd_2$/$Cd_1$/$Cd_2$=120 nm/49.58 nm/74.55 nm/110.17 nm/165.66 nm/110.17 nm/165.66 nm. Thus, the total film thickness of the aforementioned nonreflective film is 1461.38 nm. That is, the total film thickness is about 6.0 times larger than a value 245 nm corresponding to $\lambda/4$. The total film thickness of the nonreflective film is therefore much larger than that of the conventional nonreflective film.

Figure 13:
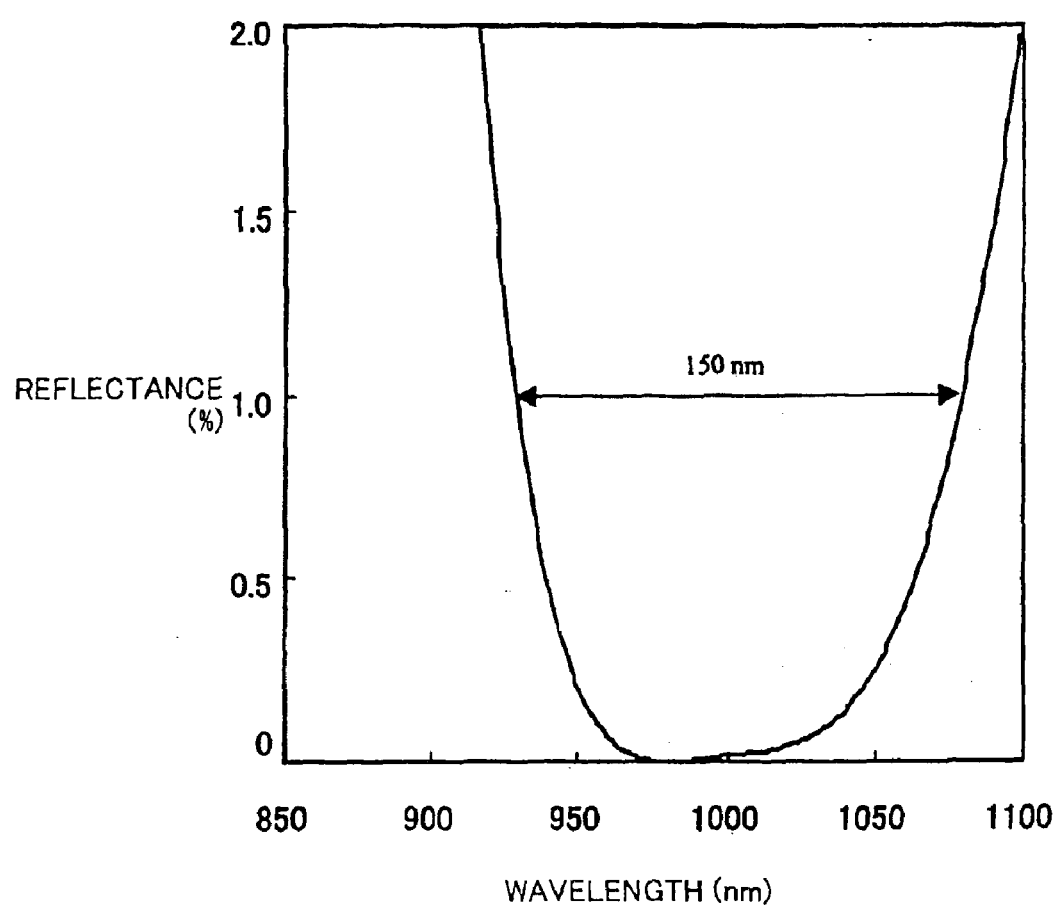
FIG. 13 shows wavelength dependence of a reflectance of the nonreflective film of the semiconductor laser of the further example of the third embodiment.

Wavelength dependence of the reflectance of this nonreflective film is similar to a bathtub curve, as shown in FIG. 13. In addition, a low-reflectance wavelength range of the nonreflective film is 150 nm. Thus, the low-reflectance wavelength range of the nonreflective film is much wider than that of the conventional nonreflective film.

When desired wavelength $\lambda=980$ nm is set as the center of the bathtub curve of the reflectance distribution, it is preferable to set phases $\phi_1$ and $\phi_2$ of tantalum oxide and alumina to 0.700522 and 0.891134, respectively, and to design the nonreflective film so as to bring the reflectance of the nonreflective film to zero at wavelength $\lambda=947$ nm.

Figure 14:
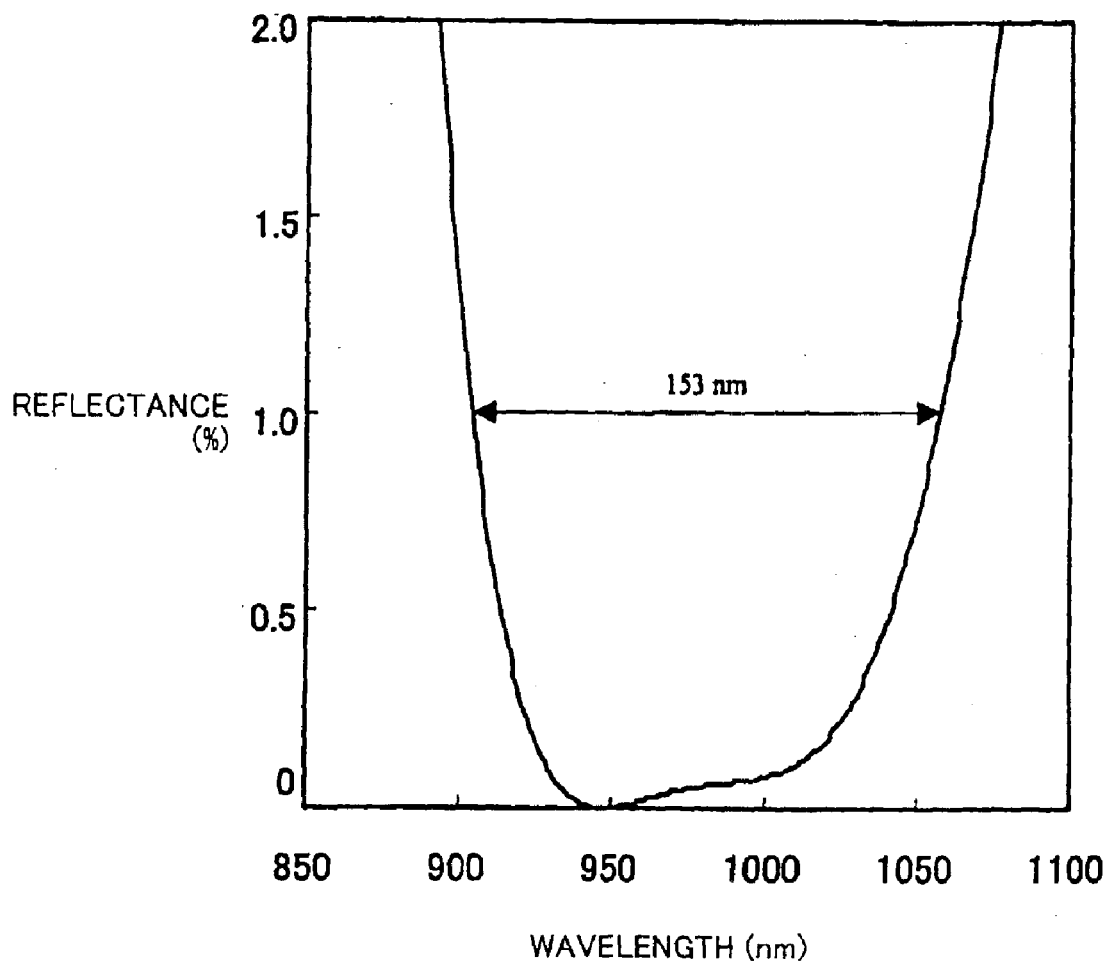
FIG. 14 shows wavelength dependence of a reflectance of a nonreflective film of another semiconductor laser of the third embodiment.

Herein, the thickness of each film is as follows. First film/second film/third film/fourth film/fifth film/sixth film/seventh film=$d_3$/$Ad_1$/$Ad_2$/$Bd_1$/$Bd_2$/$Cd_1$/$Cd_2$=120 nm/46.20 nm/74.62 nm/102.66 nm/165.82 nm/102.66 nm/165.82 nm. FIG. 14 shows wavelength dependence of the reflectance of this nonreflective film. A low-reflectance wavelength range of the nonreflective film is 153 nm.

Though examples of the nonreflective film of this embodiment including the first film of aluminum nitride having the thickness of 50 nm and 120 nm are shown, the thickness of aluminum nitride as the first film is not limited to these values, and a similar effect can also be obtained with other values.

The plurality of films forming each of the nonreflective film of the above-described first to third embodiments can easily make the low-reflectance wavelength range of the nonreflective film wider than that of the conventional non-reflective film using the design procedure of the nonreflective film described above, when the total sum of products of thicknesses and refractive indices of respective films is larger than a quarter of the wavelength of light emitted from the semiconductor optical laser.

In addition, as described above, it is desirable that an adjacent film of the plurality of films, which is provided adjacent to the semiconductor optical element, has a thermal conductivity higher than that of the other films. Though an example of the semiconductor device of this embodiment uses aluminum nitride as the adjacent film, this is not a limitation. A semiconductor optical device implementing an efficient heat radiation of a semiconductor laser can easily be designed using the above-described design procedure.

In addition, it is desirable that the low-reflectance wavelength range of the nonreflective film is equal to or wider than 100 nm. With this, a variation in wavelength of light emitted from the semiconductor optical element in a normal condition can flexibly be adapted.

Fourth Embodiment

A semiconductor laser module in an embodiment according to the present invention will now be described with reference to FIGS. 15–18. A semiconductor laser module including a semiconductor laser and a fiber grating is shown in FIG. 15.

Figure 15:
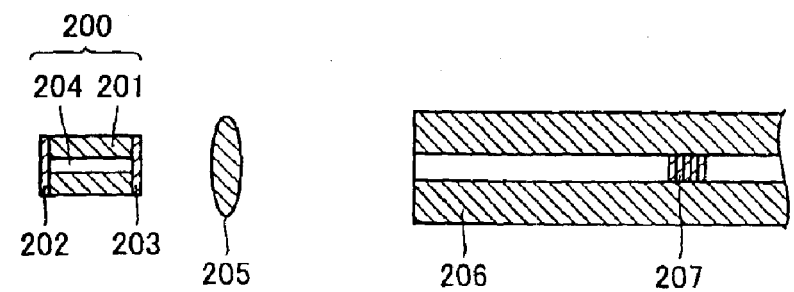
FIG. 15 shows a semiconductor laser module including a semiconductor laser having a nonreflective film of a fourth embodiment and a fiber grating.

As shown in FIG. 15, the semiconductor laser module of this embodiment includes a semiconductor laser 201, a semiconductor device 200 formed with a nonreflective film 203 provided on a front end surface side of semiconductor laser 201 and having a reflectance $R_f$ and a waveguide region 204 of semiconductor laser 201, a reflective film 202 provided on a rear end surface side of semiconductor laser 201 and having a reflectance $R_r$, a lens 205 passing light emitted from waveguide region 204 therethrough, an optical fiber 206 guiding the light passing through lens 205, and a fiber grating 207 provided in a light path of optical fiber 206 and having a reflectance $R_{fg}$.

In the semiconductor laser module of this embodiment, fiber grating 207 is provided within optical fiber 206 to stabilize an oscillation wavelength of semiconductor laser 201. Thus, light of a specific wavelength guided into optical fiber 206 is reflected with fiber grating 207.

Nonreflective film 203 is formed with any of the nonreflective films of the first to third embodiments. Reflective film 202 is formed with a film having higher reflectance than that of nonreflective film 203. Fiber grating 207 is formed with a film having higher reflectance than that of nonreflective film 203. With this, a resonator is formed with fiber grating 207 and reflective film 202, so that light resonates between fiber grating 207 and reflective film 202. Lens 205 is provided to efficiently guide the light emitted from semiconductor laser 201 into the light path of optical fiber 206.

Figure 16:
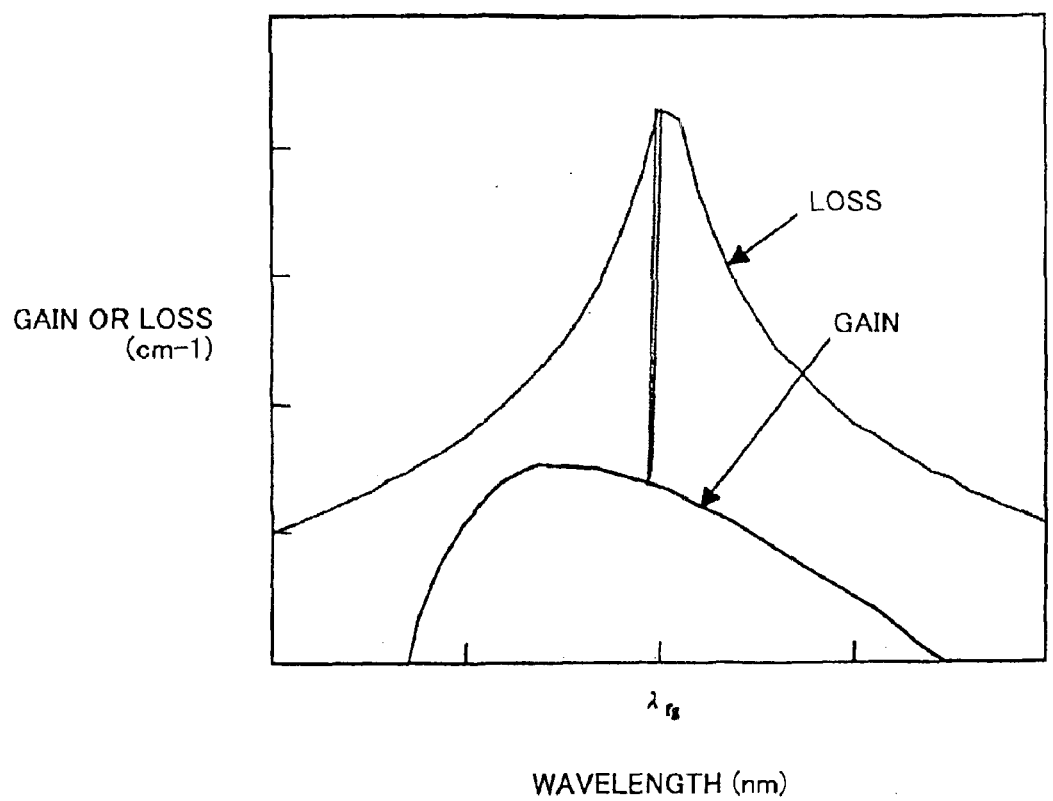
FIG. 16 shows a relation between a gain and a loss of the semiconductor laser in the semiconductor laser module of the fourth embodiment.

FIG. 16 shows a relation between a gain and a loss of the semiconductor laser of the semiconductor laser module of this embodiment provided with fiber grating 207. Fiber grating 207 has reflectance $R_{fg}$ for a specific wavelength $\lambda_{fg}$. Fiber grating 207, however, has a reflectance of about zero for wavelengths other than specific wavelength $\lambda_{fg}$. Therefore, as shown in FIG. 16, the loss of the semiconductor laser becomes extremely small locally at specific wavelength $\lambda_{fg}$. Gain data shown in FIG. 16 intersects with the extremely small local portion of loss data. As a result, the semiconductor laser module usually oscillates at specific wavelength $\lambda_{fg}$.

Figure 17:
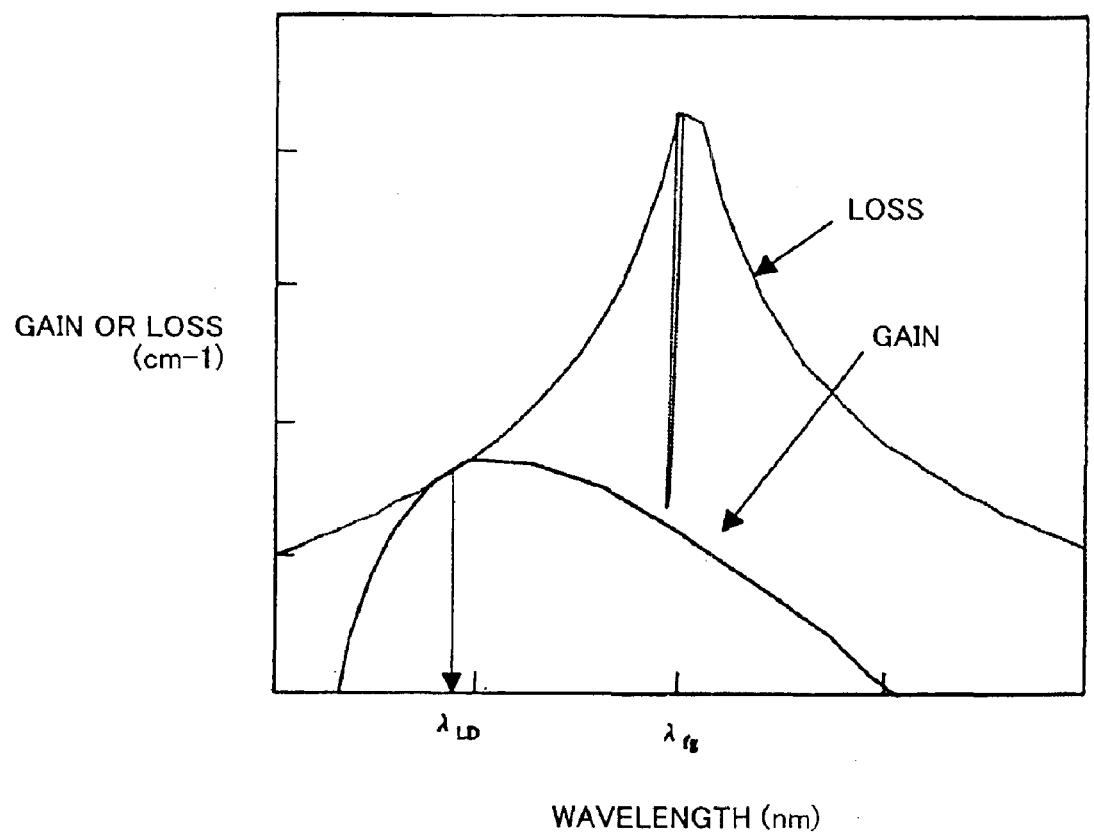
FIG. 17 shows a relation between a gain and a loss of the semiconductor laser in the semiconductor laser module of the fourth embodiment in a situation wherein the gain distribution shifts to a shorter-wavelength side when a nonreflective film having a narrow low-reflectance wavelength range is used.

The gain distribution of the semiconductor laser, however, shifts to a shorter-wavelength side when, for example, an ambient temperature is low. Therefore, the loss of the semiconductor laser determined with nonreflective film 203 may become smaller than the loss of the semiconductor laser determined with fiber grating 207, as shown in FIG. 17. In this situation, gain data shown in FIG. 17 intersects with a portion of loss data other than the extremely small local portion. Thus, the semiconductor laser module oscillates at a wavelength $\lambda_{LD}$, not at wavelength $\lambda_{fg}$. As a result, a side mode repression ratio, which is a ratio of the intensity of light at wavelength $\lambda_{LD}$ to that at wavelength $\lambda_{fg}$, disadvantageously becomes smaller, or the semiconductor laser disadvantageously oscillates at a wavelength other than the wavelength determined with the loss of fiber grating 207 as described above.

Figure 18:
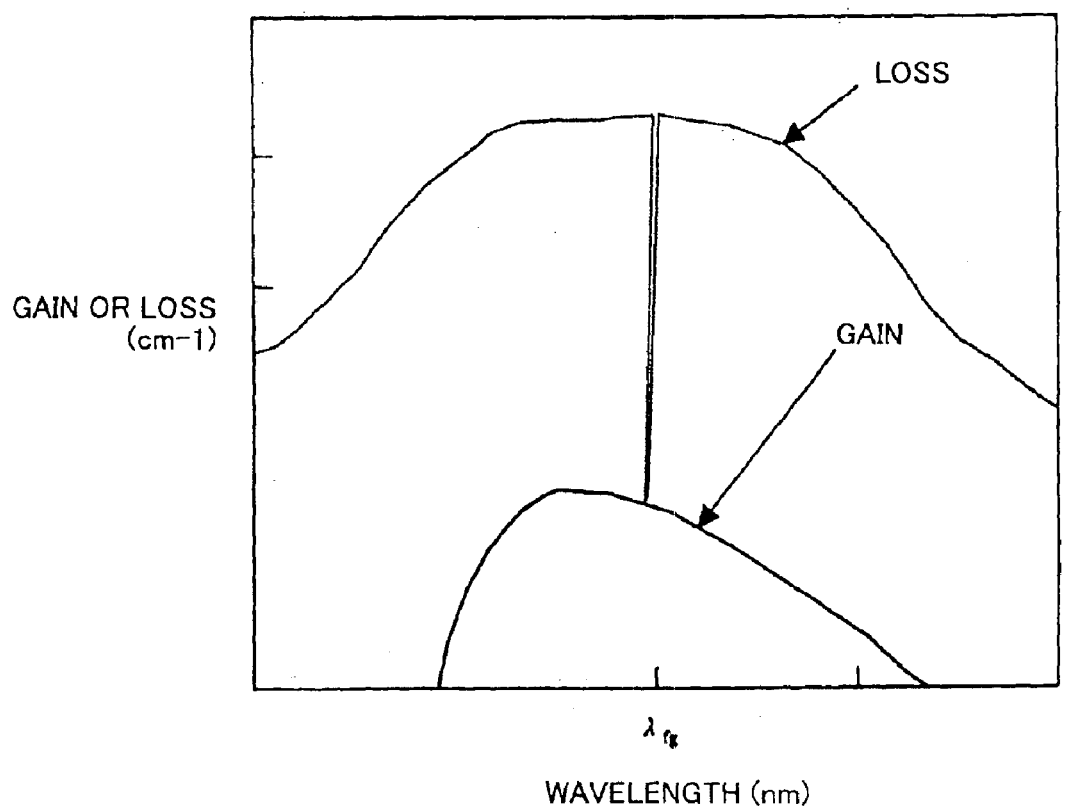
FIG. 18 shows a relation between a gain and a loss of the semiconductor laser in the semiconductor laser module of the fourth embodiment in a situation wherein a nonreflective film has a wide low-reflectance wavelength range.
Figure 19:
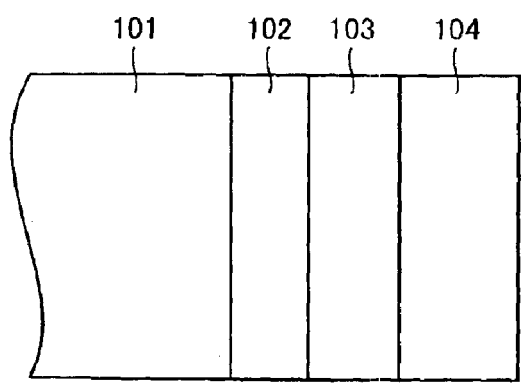
FIG. 19 shows a nonreflective film of a conventional semiconductor optical element.
Figure 20:
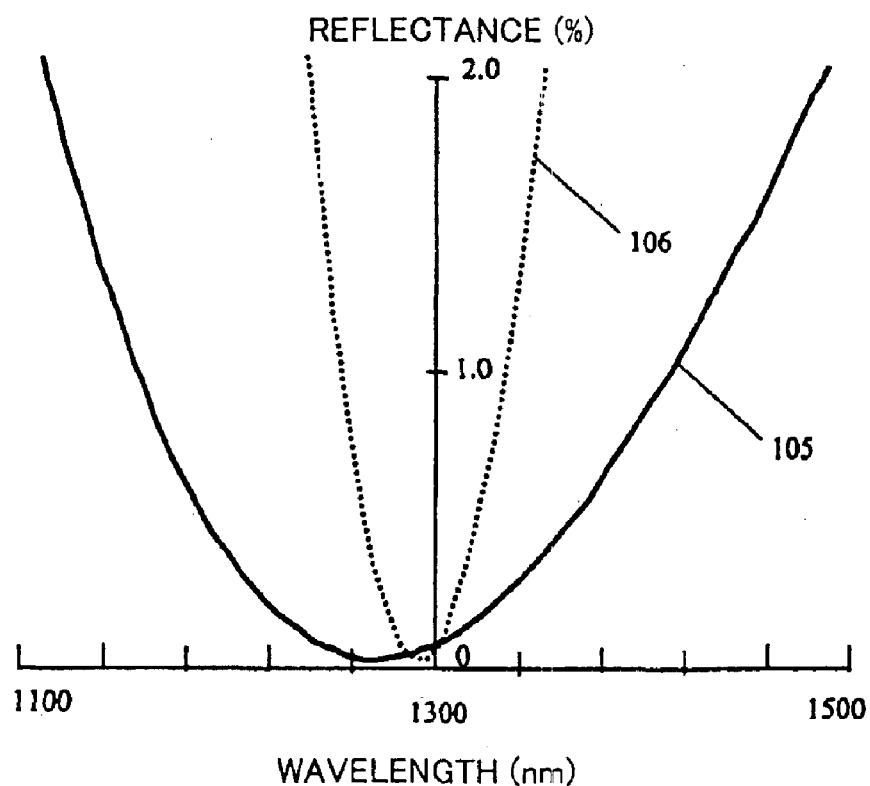
FIG. 20 shows wavelength dependence of a reflectance of the nonreflective film of the conventional semiconductor optical element.

As shown in FIG. 18, in the semiconductor laser module of this embodiment, nonreflective film 203 having a low-reflectance wavelength range equal to or wider than 100 nm is provided on the front end surface side of semiconductor laser 201. Therefore, loss data shown in FIG. 18 has a gentle convex curve rather than a curve with steep slope portions as the loss data shown in FIGS. 16 and 17. As a result, the loss of the semiconductor laser determined with fiber grating 207 can be made smaller than the loss of the semiconductor laser determined with the reflectance of nonreflective film 203 at wider wavelength range. That is, gain data intersects with the extremely small local portion of loss data even when the gain distribution shifts to a shorter-wavelength side or a longer-wavelength side to some extent. Therefore, the oscillation at wavelength $\lambda_{LD}$ shown in FIG. 17 can be suppressed, and the side mode suppression ratio of semiconductor laser 201 can be prevented from becoming smaller.

A seven-layer structure nonreflective film is shown as an example for each semiconductor optical device of above-described first to fourth embodiments. The structure of the nonreflective film according to the present invention, however, is not limited to the seven-layer structure, and may be a structure having any number of layers such as a nine-layer structure or an eleven-layer structure, so long as it includes a plurality of films having at least three kinds of refractive indices.

For the parameters A, B and C of each nonreflective film of the first to fourth embodiments, prescribed values are shown in each embodiment as an example. The parameters of the nonreflective film of the present invention, however, are not limited to the prescribed values used in the nonreflective film of each embodiment. Similar effects as with the nonreflective films of the first to fourth embodiments can be obtained with parameters of the nonreflective film having other values, so long as the values can respectively bring the real part and imaginary part of the amplitude reflectance to zero.

Each semiconductor optical device of the first to fourth embodiments is described with the nonreflective film formed with a plurality of films having three kinds of refractive indices as an example. Even if the plurality of films forming the nonreflective film have equal to or more than four kinds of refractive indices, however, when thicknesses of specific two kinds of films are determined so as to respectively bring the real part and imaginary part of the amplitude reflectance of the plurality of films to zero with the procedure described above, similar effects as with the nonreflective films of the first to fourth embodiments can be obtained by previously setting phase conditions, that is, thicknesses of the films other than the specific two kinds of films of the plurality of films.

Furthermore, though each example of the semiconductor optical device of the first to third embodiments uses a semiconductor laser as an example of semiconductor optical element, similar effect as that with the semiconductor laser can be obtained with a semiconductor optical element such as a semiconductor amplifier, a super luminescent diode, or a light modulator.

In addition, though each semiconductor optical device of the first to fourth embodiments uses the value near 980 nm as the wavelength of light emitted from the semiconductor optical element, the wavelength of light emitted from the semiconductor optical element is not limited to this value. Similar effects as that with the semiconductor optical devices of the first to fourth embodiments can be obtained with visible light, far infrared, infrared, or the like.

In the first to third embodiments a film deposited by electron beam (EB) vapor deposition is used to configure a semiconductor optical device. EB vapor deposition, however, can fail to provide a film having a satisfactorily controlled thickness. Accordingly in fifth to seventh embodiments described hereinafter electrons cyclotron resonance (ECR) sputtering is employed to better control thickness of film to provide an improved semiconductor optical device, as described hereinafter.

It should be noted, however, that although the cause is still not obvious, in employing ECR sputtering, satisfactory contact is not achieved between alumina ($Al_2O_3$) and tantalum oxide ($Ta_2O_5$). Accordingly in the fifth to seventh embodiments a semiconductor optical device utilizing contact of silicon oxide ($SiO_2$) and tantalum oxide ($Ta_2O_5$) is used.

Note that the semiconductor optical device of the fifth to seventh embodiments used in the semiconductor laser described in the fourth embodiment can provide an effect similar to that which the semiconductor optical device of the first to third embodiments obtains by the semiconductor laser of the fourth embodiment.

Furthermore in each of the fifth to seventh embodiments the two-layer structure described in the first to third embodiments plus two types of film are used to provide a nonreflective film, for which an approach similar to that employed to design the non-reflective film of the two-layer structure described in the first to third embodiments, i.e., an approach that brings the real and imaginary parts of amplitude reflectance (r) to zero is also employed to calculate film thicknesses $D_1$ and $D_2$, as described hereinafter.

Fifth Embodiment

The fifth embodiment provides a semiconductor optical device, as will be described hereinafter with reference to FIGS. 21–27.

Figure 21:
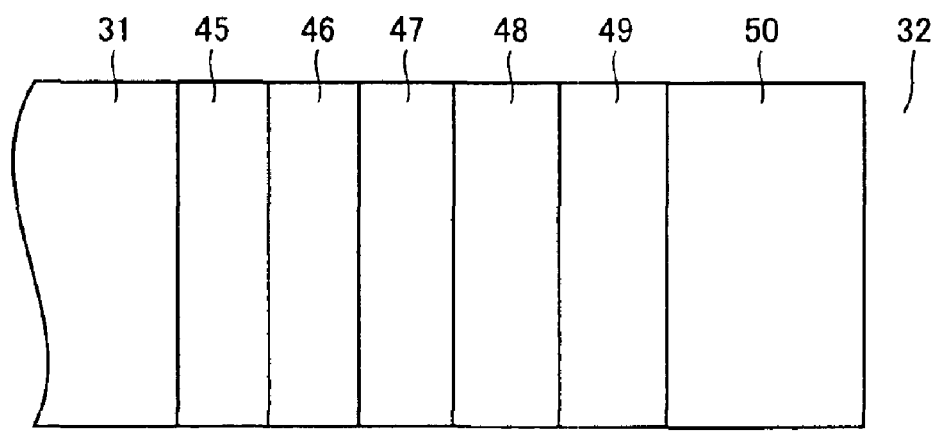
FIG. 21 shows a nonreflective film of a semiconductor laser in a fifth embodiment.

As shown in FIG. 21, the present embodiment provides a semiconductor optical device including semiconductor layer 31 and a non-reflective film provided in space 32 of air, nitrogen or the like having a refractive index of one. The non-reflective film is formed of two specific types of film known in refractive index and unknown in thickness that are stacked in two stages to provide a 4-layer structure, and additional, two specific types of film known in refractive index and known in thickness.

More specifically, with reference to FIG. 21, the nonreflective film includes a first film 45 of alumina ($Al_2O_3$) (refractive index $n_3$=1.629, thickness $d_3$), a second film 46 of silicon oxide ($SiO_2$) (refractive index $n_3$=1.484, thickness=$Ad_2$), a third film 47 of tantalum oxide ($Ta_2O_5$) (refractive index $n_1$=2.072, thickness=$Bd_1$), a fourth film 48 of silicon oxide ($SiO_2$) (refractive index $n_2$=1.484, thickness=$Bd_2$), a fifth film 49 of tantalum oxide ($Ta_2O_5$) (refractive index $n_1$=2.072, thickness=$Cd_1$), and a sixth film 50 of silicon oxide ($SiO_2$) (refractive index $n_2$=1.484, thickness=$Cd_2$).

Note that in the expressions representing thickness, algebra A, B and C are predetermined parameters, similarly as employed in the first to third embodiments.

Initially will be described the nonreflective film with the first film 45 of alumina ($Al_2O_3$) having thickness $d_3$ of 10 nm. Note that in the present and subsequent embodiments an example of refractive index of each layer obtained when ECR sputtering is used for deposition is shown.

In the present embodiment the real and imaginary parts of the amplitude reflectance of the nonreflective film can both be brought to zero at wavelength $\lambda$=980 nm when A=0.18, B=1.99 and C=2.00, and when phases $\phi_1$ and $\phi_2$ of tantalum oxide and silicon oxide are 0.581355 and 0.899203, respectively.

Herein, the thickness of each film is as follows. First film/second film/third film/fourth film/fifth film/sixth film= $d_3/Ad_2/Bd_1/Bd_3/Cd_1/Cd_3/$=10 nm/17.01 nm/87.08 nm/188.07 nm/87.52 nm/189.02 nm.

Figure 22:
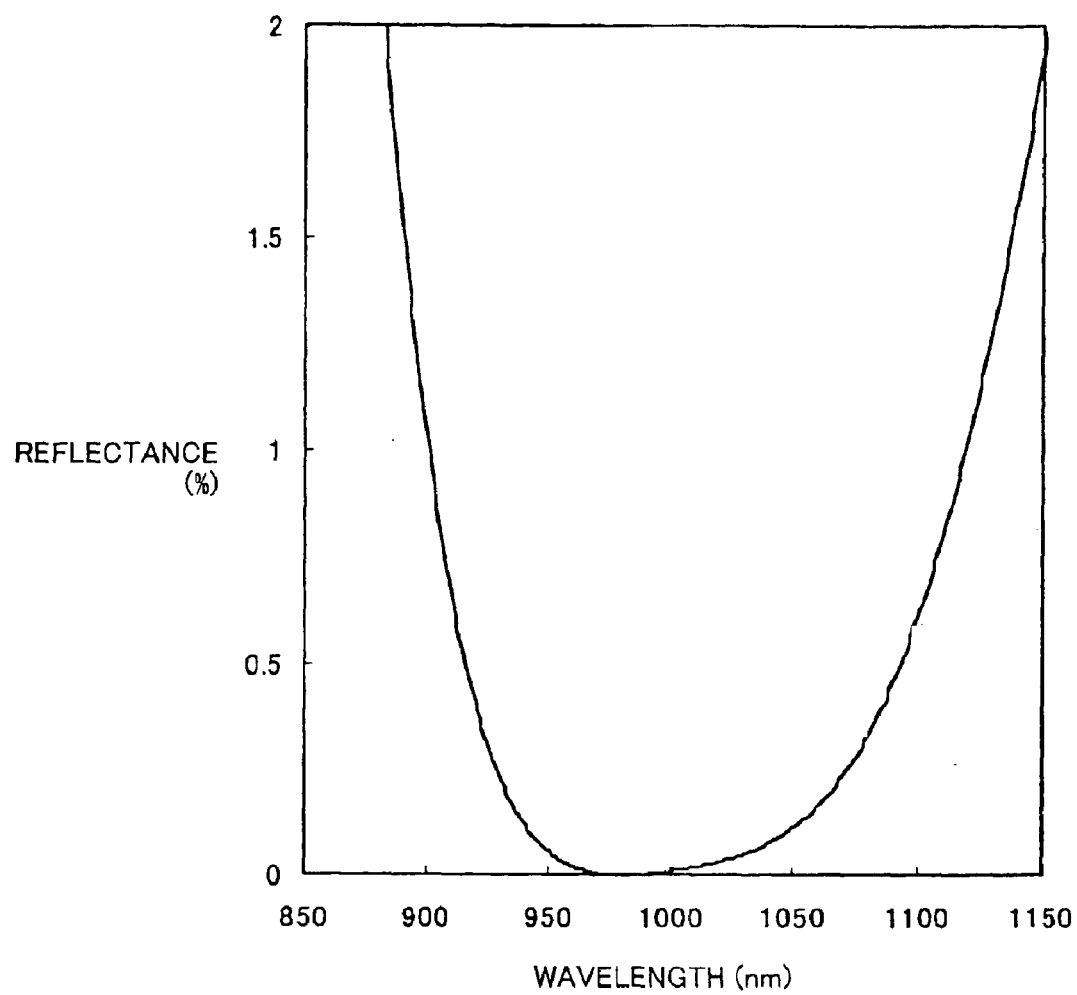
FIGS. 22–27 show wavelength dependence of a reflectance of a nonreflective film of a semiconductor laser in first to sixth examples, respectively, of the fifth embodiment.

Thus, the total film thickness is 962.91 nm. This value is about 3.9 times larger than a film thickness of 245 nm, which corresponds to λ/4. The wavelength dependence of the reflectance of the nonreflective film is similar to a bathtub curve, as shown in FIG. 22. As such, a 1% or lower reflectance wavelength range of the nonreflective film is 217 nm, which is much wider than that of the conventional nonreflective film.

A desired wavelength λ=980 nm can be set as the center of the bathtub curve of the reflectance distribution simply by setting phases $\phi_1$ and $\phi_2$ of tantalum oxide and silicon oxide to 0.580136 and 0.908343, respectively, and designing the nonreflective film so as to bring the reflectance of the nonreflective film to zero at wavelength λ=945 nm.

Herein, the thickness of each film is as follows. First film/second film/third film/fourth film/fifth film/sixth film/= $d_3/Ad_2/Bd_1/Bd_3/Cd_1/Cd_3/=10$ nm/16.57 nm/83.80 nm/183.20 nm/84.22 nm/184.12 nm.

Figure 23:
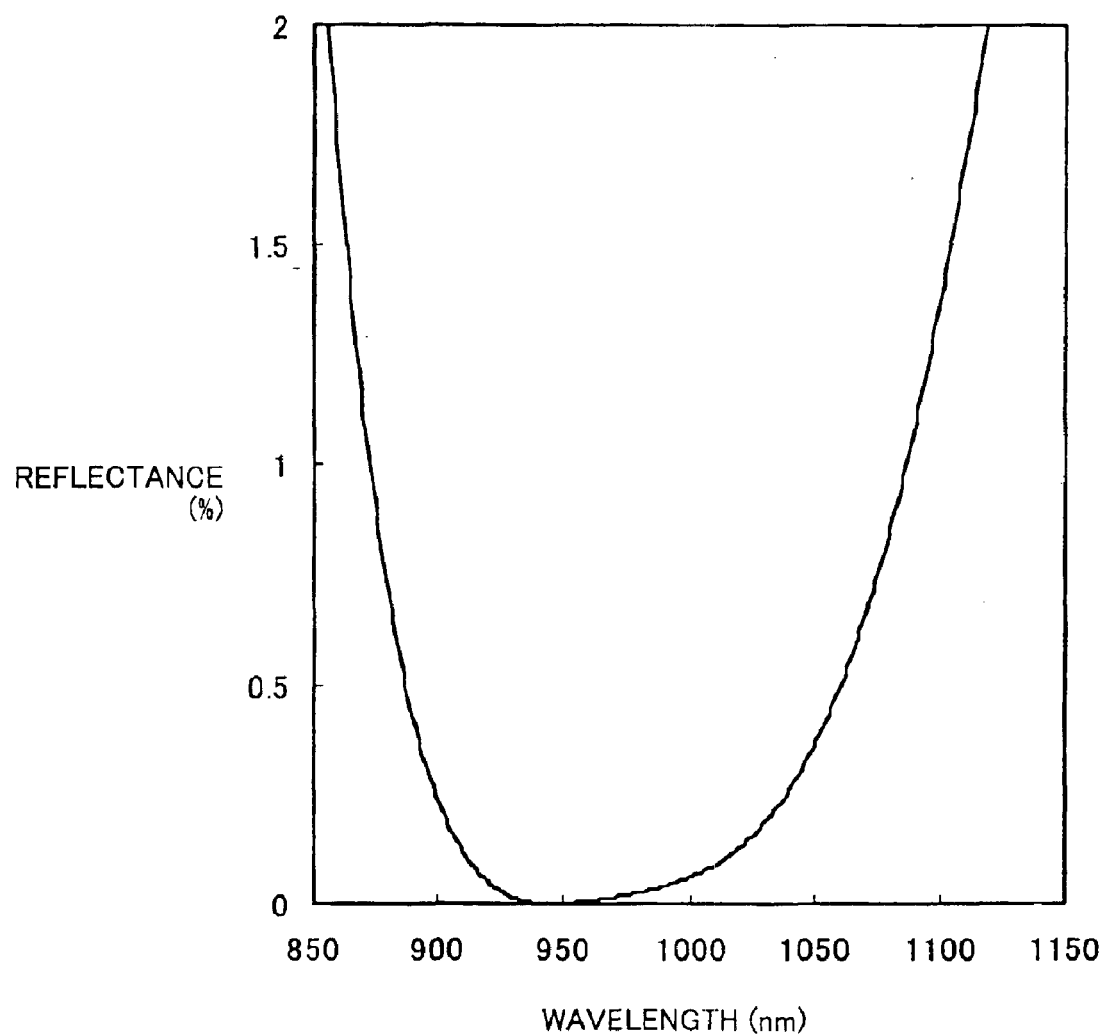

FIG. 23 shows wavelength dependence of the reflectance of the nonreflective film. The 1% or lower reflectance wavelength range of the nonreflective film is 213 nm.

Subsequently will be described the nonreflective film with the first film 45 of alumina ($Al_2O_3$) having thickness $d_3$ of 20 nm. In the nonreflective film a reflectance of zero is provided at wavelength λ=980 nm when A=0.12, B=1.90 and C=2.00, and when phases $\phi_1$ and $\phi_2$ of tantalum oxide and silicon oxide are 0.601513 and 0.911814, respectively.

Herein, the thickness of each film is as follows. First film/second film/third film/fourth film/fifth film/sixth film= $d_3/Ad_2/Bd_1/Bd_2/Cd_1/Cd_2/=20$ nm/11.50 nm/86.03 nm/182.08 nm/90.56 nm/191.67 nm. The total film thickness is 970.19 nm, which is about 4.0 times larger than 245 nm, one forth of wavelength λ.

Figure 24:
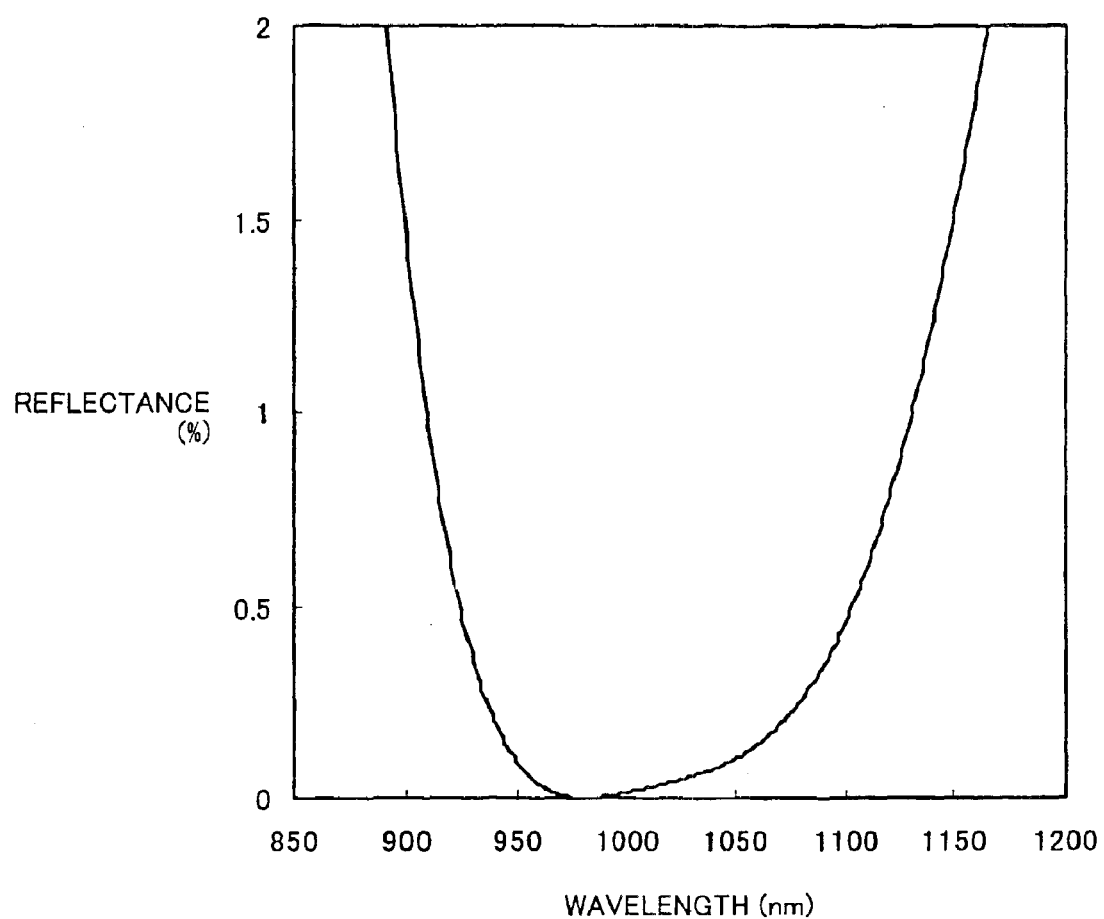

As such, the total film thickness of the nonreflective film is therefore much larger than that of the conventional nonreflective film. The wavelength dependence of the reflectance of the nonreflective film is similar to a bathtub curve, as shown in FIG. 24. Furthermore, the 1% or lower reflectance wavelength range of the nonreflective film is 220 nm, which is much wider than that of the conventional nonreflective film.

The desired wavelength λ=980 nm can be set as the center of the bathtub curve of the reflectance distribution simply by setting phases $\phi_1$ and $\phi_2$ of tantalum oxide and silicon oxide to 0.596734 and 0.925211, respectively, and designing the nonreflective film so as to bring the reflectance of the nonreflective film to zero at wavelength λ=935 nm.

Figure 25:
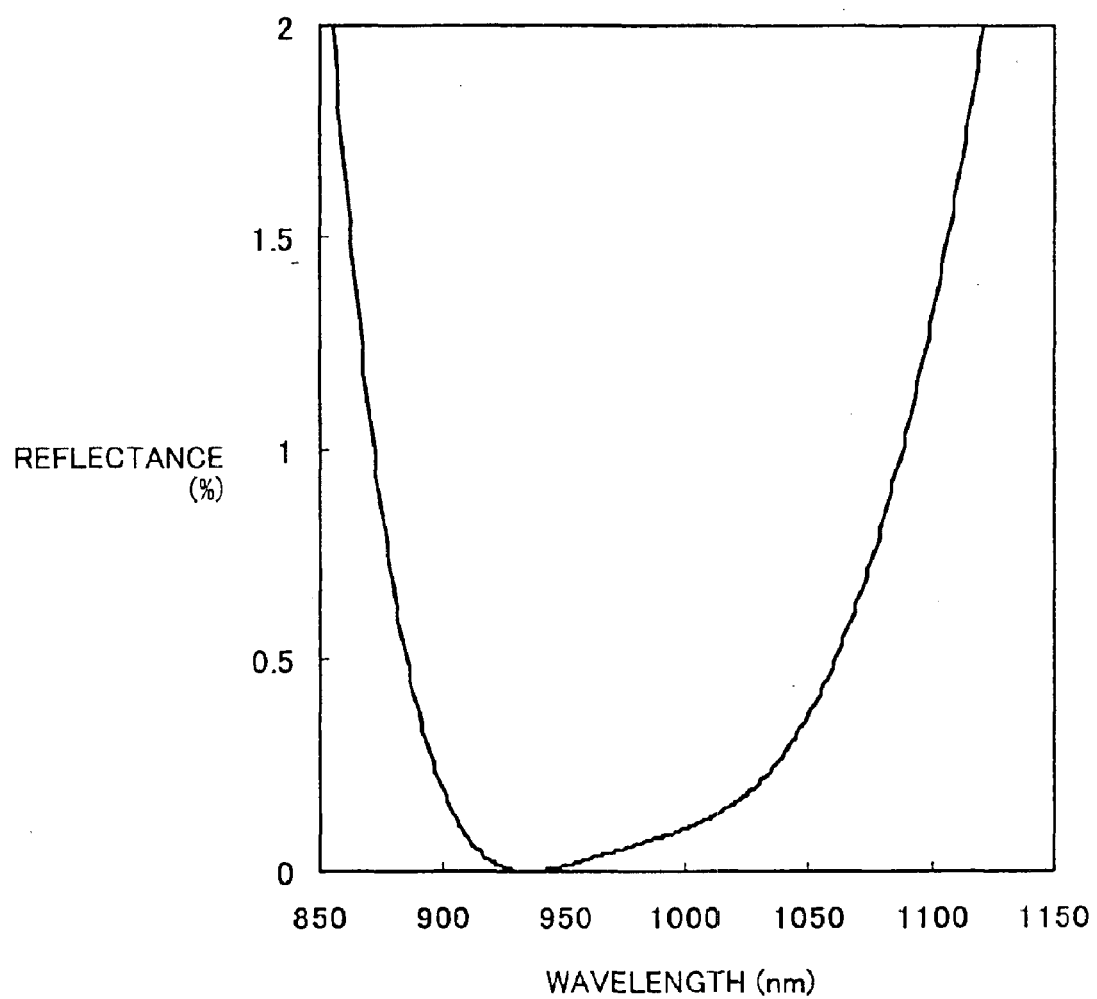

Herein, the thickness of each film is as follows. First film/second film/third film/fourth film/fifth film/sixth film/= $d_3/Ad_2/Bd_1/Bd_2/Cd_1/Cd_2/=20$ nm/11.13 nm/81.43 nm/176.28 nm/85.71 nm/185.55 nm. FIG. 25 shows the wavelength dependence of the reflectance of the nonreflective film. The 1% or lower reflectance wavelength range of the nonreflective film is 215 nm.

Furthermore will be described the nonreflective film with the first film 45 of alumina ($Al_2O_3$) having thickness $d_3$ of 40 nm. In the nonreflective film a reflectance of zero is provided at wavelength λ=980 nm when A=0.02, B=1.50 and C=2.00, and when phases $\phi_1$ and $\phi_2$ of tantalum oxide and silicon oxide are 0.789974 and 0.884697, respectively.

Herein, the thickness of each film is as follows. First film/second film/third film/fourth film/fifth film/sixth film= $d_3/Ad_2/Bd_1/Bd_2/Cd_1/Cd_2/=40$ nm/1.86 nm/89.20 nm/139.48 nm/118.93 nm/185.97 nm. The total film thickness is 982.13 nm, which is about 4.0 times larger than 245 nm, one forth of wavelength λ. As such, the total film thickness of the nonreflective film is therefore much larger than that of the conventional nonreflective film.

Figure 26:
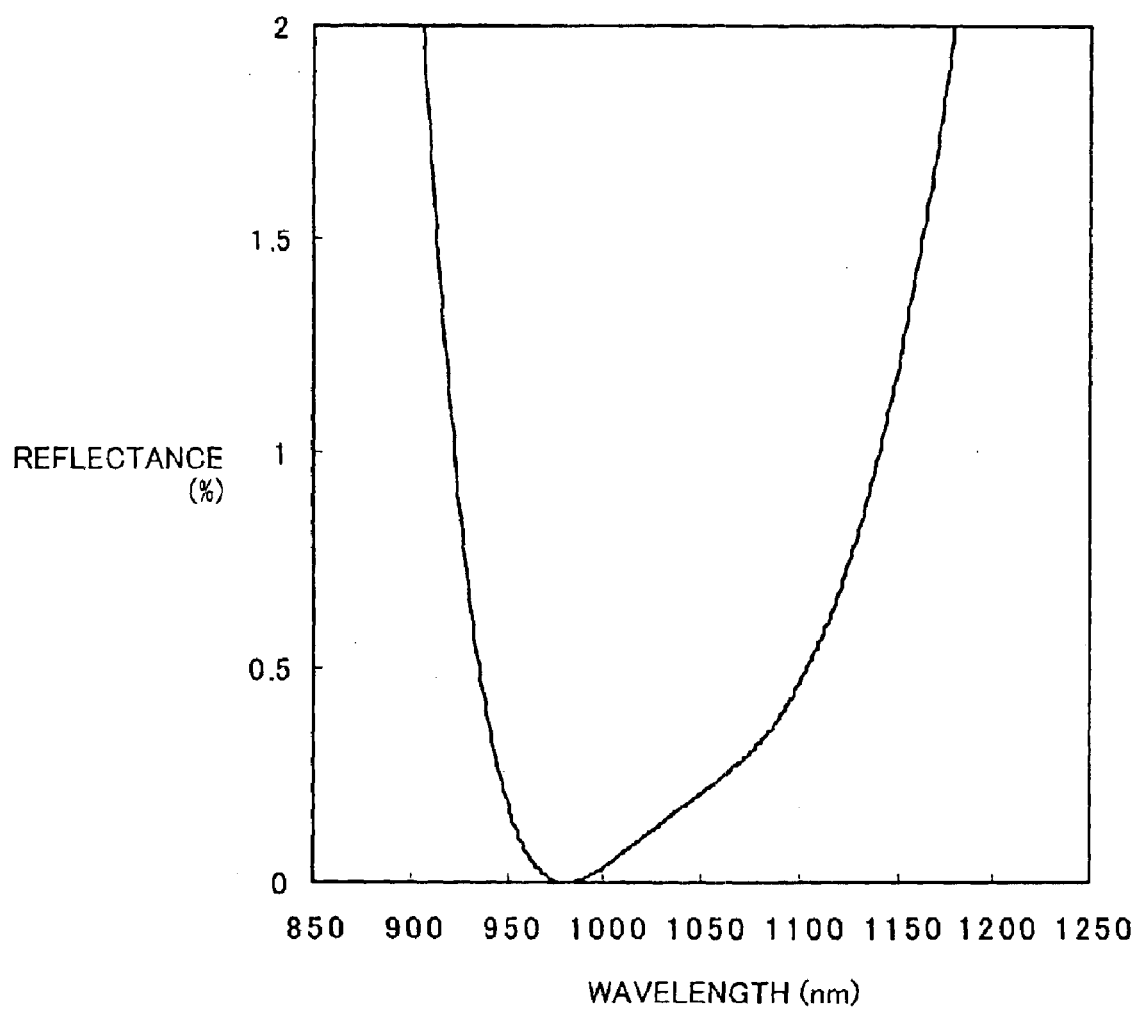

The wavelength dependence of the reflectance of the nonreflective film is similar to a bathtub curve, as shown in FIG. 26. Furthermore, the 1% or lower reflectance wavelength range of the nonreflective film is 218 nm, which is much larger than that of the conventional nonreflective film.

To set the desired wavelength λ=980 nm as the center of the bathtub curve of the reflectance distribution, phases $\phi_1$ and $\phi_2$ of tantalum oxide and silicon oxide are set to 0.774569 and 0.901877, respectively, and at wavelength λ=927 nm the nonreflective film's reflectance attains zero.

Figure 27:
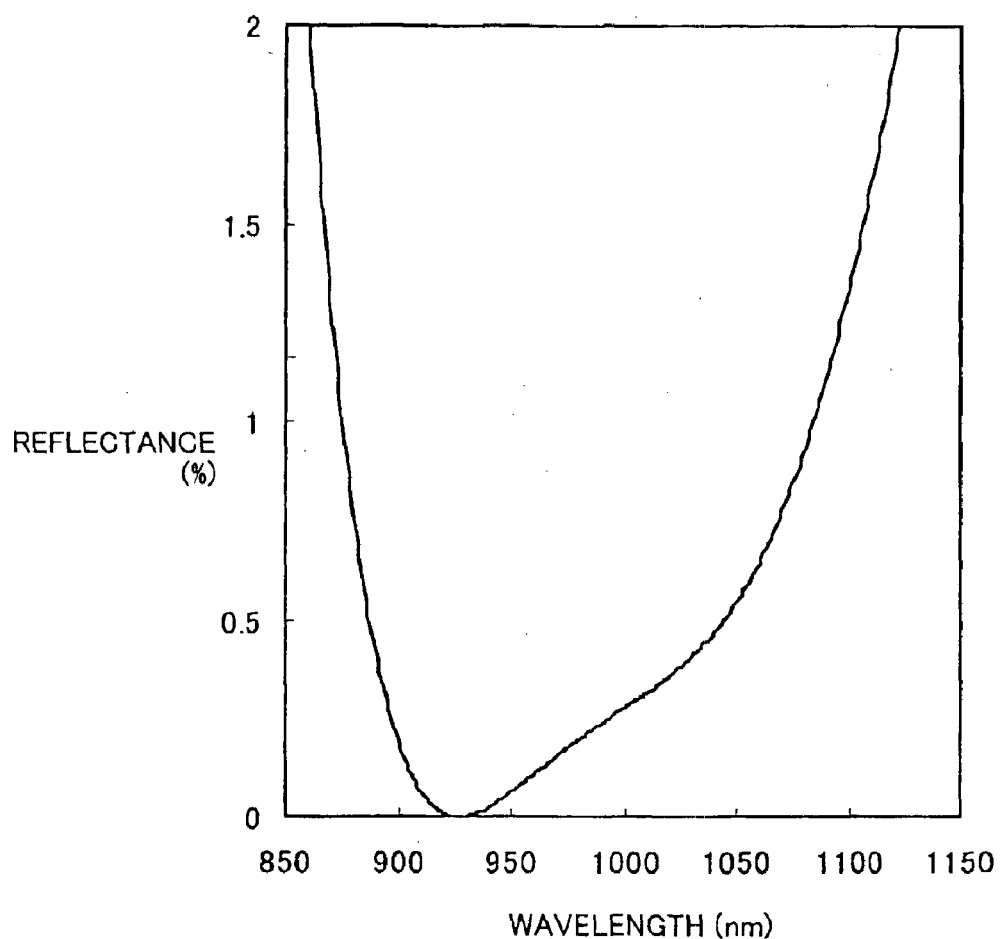

Herein, the thickness of each film is as follows. First film/second film/third film/fourth film/fifth film/sixth film/= $d_3/Ad_2/Bd_1/Bd_2/Cd_1/Cd_2/=40$ nm/1.79 nm/82.73 nm/134.50 nm/110.31 nm/179.33 nm. FIG. 27 shows the wavelength dependence of the reflectance of the nonreflective film. The 1% or lower reflectance wavelength range of the nonreflective film is 208 nm.

Note that the aforementioned 6-layer nonreflective film is designed using the following expression:

$$\begin{pmatrix} m_{11} & m_{12} \\ m_{21} & m_{22} \end{pmatrix} = \begin{pmatrix} \cos\phi_3 & -\frac{i}{n_3}\sin\phi_3 \\ -in_3\sin\phi_3 & \cos\phi_3 \end{pmatrix} \times \begin{pmatrix} \cos A\phi_2 & -\frac{i}{n_2}\sin A\phi_2 \\ -in_2\sin A\phi_2 & \cos A\phi_2 \end{pmatrix} \times \begin{pmatrix} \cos B\phi_1 & -\frac{i}{n_1}\sin B\phi_1 \\ -in_1\sin B\phi_1 & \cos B\phi_1 \end{pmatrix} \times \begin{pmatrix} \cos B\phi_2 & -\frac{i}{n_2}\sin B\phi_2 \\ -in_2\sin B\phi_2 & \cos B\phi_2 \end{pmatrix} \times \begin{pmatrix} \cos C\phi_1 & -\frac{i}{n_1}\sin C\phi_1 \\ -in_1\sin C\phi_1 & \cos C\phi_1 \end{pmatrix} \times \begin{pmatrix} \cos C\phi_2 & -\frac{i}{n_2}\sin C\phi_2 \\ -in_2\sin C\phi_2 & \cos C\phi_2 \end{pmatrix}. \tag{8}$$

When expression (8) is used, thicknesses $d_1$ and $d_2$ are calculated to bring to zero each of the real and imaginary parts of amplitude reflectance (r) represented in expression (3c).

Sixth Embodiment

A sixth embodiment provides a semiconductor optical device, as will be described hereinafter with reference to FIGS. 28–34.

Figure 28:
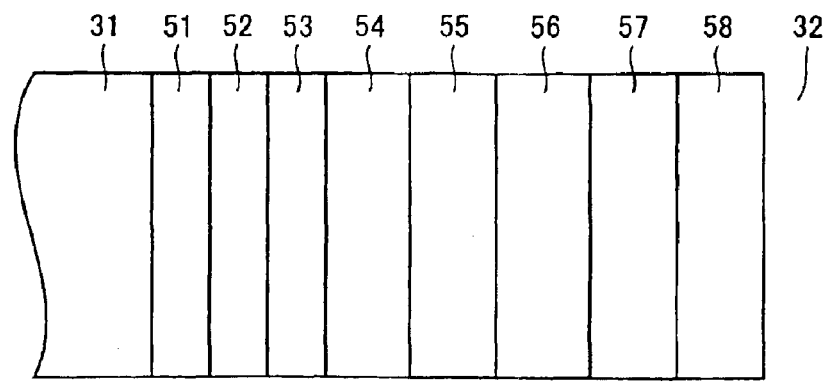
FIG. 28 shows a nonreflective film of a semiconductor laser in a sixth embodiment.

As shown in FIG. 28, the present embodiment provides a semiconductor optical device including semiconductor laser 31 and a non-reflective film provided in space 32 of air, nitrogen or the like having a refractive index of one. The non-reflective film is formed of two specific types of film known in refractive index and unknown in thickness that are stacked in three stages to provide a 6-layer structure, and additional, two specific types of film known in refractive index and known in thickness.

As shown in FIG. 28, the nonreflective film includes a first film 51 of alumina ($Al_2O_3$) (refractive index $n_3$=1.629, thickness $d_3$), a second film 52 of silicon oxide ($SiO_2$) (refractive index $n_2$=1.484, thickness=$Ad_2$), a third film 53 of tantalum oxide ($Ta_2O_5$) (refractive index $n_1$=2.072, thickness=$Bd_1$), a fourth film 54 of silicon oxide ($SiO_2$) (refractive index $n_2$=1.484, thickness=$Bd_2$), a fifth film 55 of tantalum oxide ($Ta_2O_5$) (refractive index $n_1$=2.072, thickness=$Cd_1$), a sixth film 56 of silicon oxide ($SiO_2$) (refractive index $n_2$=1.484, thickness=$Cd_2$), a seventh film 57 of tantalum oxide ($Ta_2O_5$) (refractive index $n_1$=2.072, thickness=$Dd_1$), and an eighth film 58 of silicon oxide (refractive index $n_2$=1.484, thickness=$Dd_2$).

Initially will be described the nonreflective film with the first film 51 of alumina ($Al_2O_3$) having thickness $d_3$ of 10 nm.

The above mentioned nonreflective film allows reflectance to be zero for wavelength λ=980 nm when A=0.50, B=2.00, C=2.00 and D=2.00 and when phases $\phi_1$ and $\phi_2$ of tantalum oxide and silicon oxide are 0.356965 and 1.03993, respectively.

Herein, the thickness of each film is as follows. First film/second film/third film/fourth film/fifth film/sixth film/seventh film/eight film=$d_3$/$Ad_2$/$Bd_1$/$Bd_2$/$Cd_1$/$Cd_2$/$Dd_1$/$Dd_2$=10 nm/54.65 nm/53.74 nm/218.60 nm/53.74 nm/218.60 nm/53.74 nm/218.60 nm. The total film thickness is 1404.65 nm, which is about 5.7 times larger than 245 nm, one forth of wavelength $\lambda$.

Figure 29:
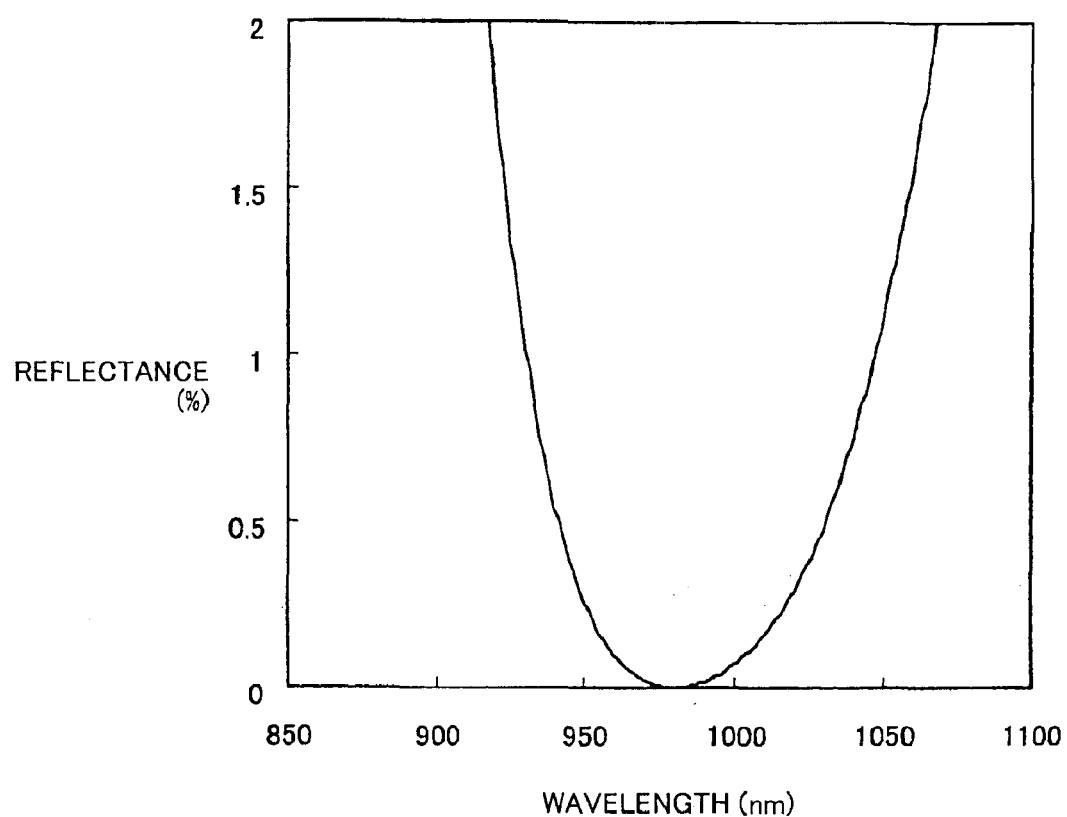
FIGS. 29–34 show wavelength dependence of a reflectance of a nonreflective film of a semiconductor laser in first to sixth examples, respectively, of the sixth embodiment.

As such, the total film thickness of the nonreflective film is much larger than that of the conventional nonreflective film. The wavelength dependence of the reflectance of the nonreflective film is similar to a bathtub curve, as shown in FIG. 29. Furthermore, the 1% or lower reflectance wavelength range of the nonreflective film is 116 nm, which is much larger than that of the conventional nonreflective film.

The desired wavelength $\lambda$=980 nm can be set as the center of the bathtub curve of the reflectance distribution simply by setting phases $\phi_1$ and $\phi_2$ of tantalum oxide and silicon oxide to 0.357013 and 1.0386, respectively, and bringing the reflectance of the nonreflective film to zero for wavelength $\lambda$=971 nm.

Figure 30:
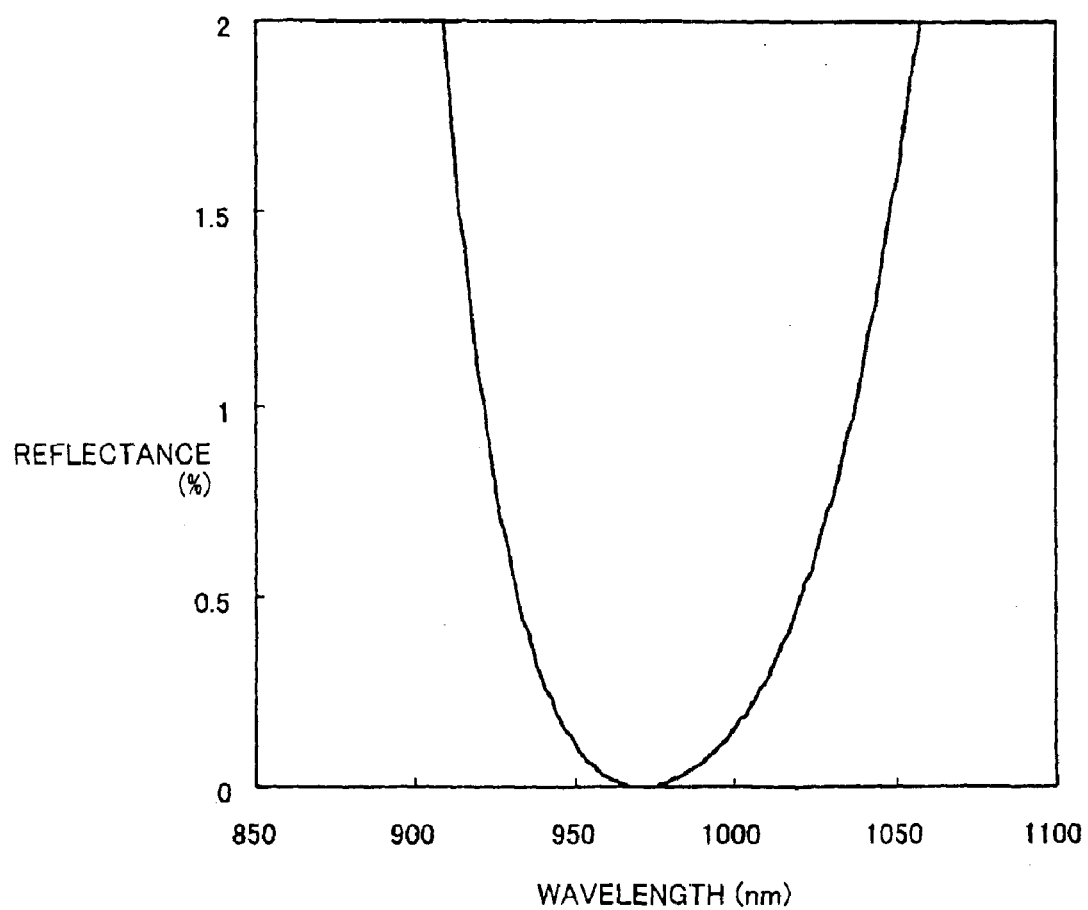

Herein, the thickness of each film is as follows. First film/second film/third film/fourth film/fifth film/sixth film/seventh film/eighth film=$d_3$/$Ad_2$/$Bd_1$/$Bd_2$/$Cd_1$/$Cd_2$/$Dd_1$/$Dd_2$/=10 nm/54.08 nm/53.26 nm/216.31 nm/53.26 nm/216.31 nm/53.26 nm/216.31nm. FIG. 30 shows the wavelength dependence of the reflectance of the nonreflective film. The 1% or lower reflectance wavelength range of the nonreflective film is 115 nm.

Subsequently will be described the nonreflective film with the first film 51 of alumina ($Al_2O_3$) having thickness $d_3$ of 20 nm. The nonreflective film allows reflectance to be zero for wavelength $\lambda$=980 nm when A=0.42, B=2.00, C=2.00 and D=2.00 and when phases $\phi_1$ and $\phi_2$ of tantalum oxide and silicon oxide are 0.355425 and 1.03088, respectively.

Herein, the thickness of each film is as follows. First film/second film/third film/fourth film/fifth film/sixth film/seventh film/eight film=$d_3$/$Ad_2$/$Bd_1$/$Bd_2$/$Cd_1$/$Cd_2$/$Dd_1$/$Dd_2$=20 nm/45.51 nm/53.51 nm/216.70 nm/53.51 nm/216.70 nm/53.51 nm/216.70 nm. The total film thickness is 1397.48 nm, which is about 5.7 times larger than 245 nm, one forth of wavelength $\lambda$.

Figure 31:
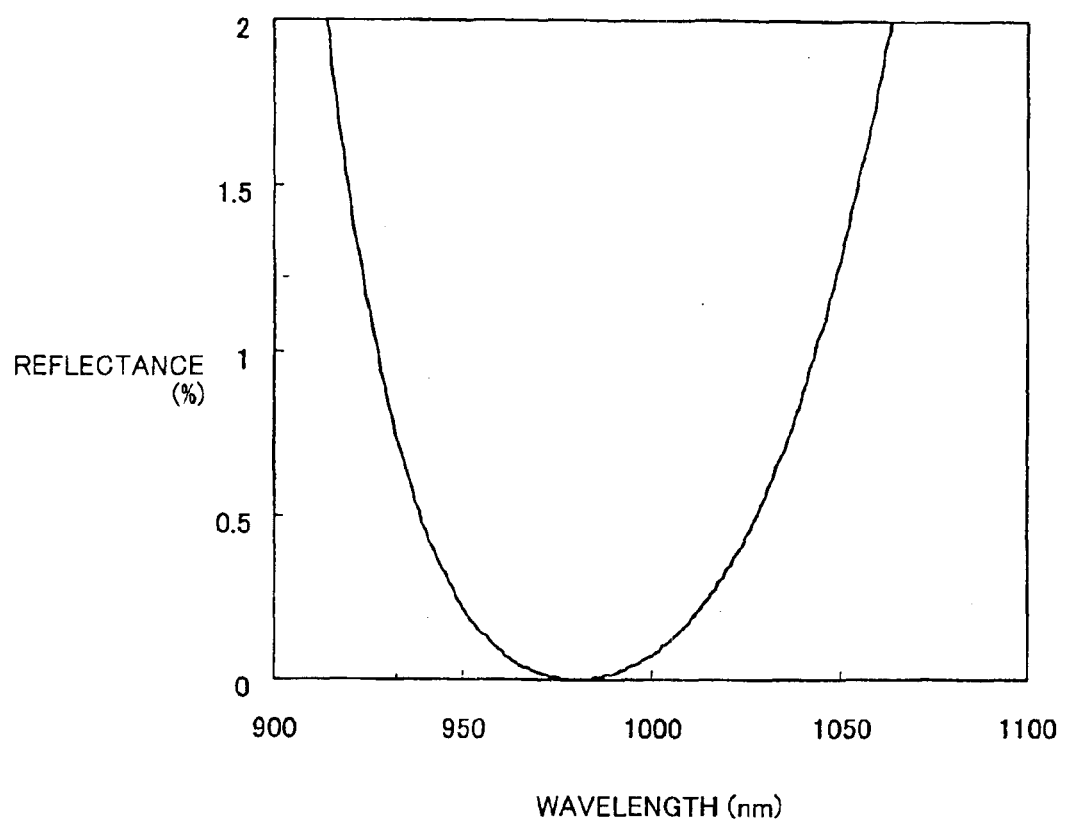

As such, the total film thickness of the nonreflective film is much larger than that of the conventional nonreflective film. The wavelength dependenceof the reflectance of the nonreflective film is similar to a bathtub curve, as shown in FIG. 31. Furthermore, the 1% or lower reflectance wavelength range of the nonreflective film is 116 nm, which is much larger than that of the conventional nonreflective film.

To set the desired wavelength $\lambda$=980 nm as the center of the bathtub curve of the reflectance distribution, phases $\phi_1$ and $\phi_2$ of tantalum oxide and silicon oxide are set to 0.35537 and 1.02959, respectively, and for a wavelength $\lambda$=975 nm the reflectance of the nonreflective film attains zero.

Figure 32:
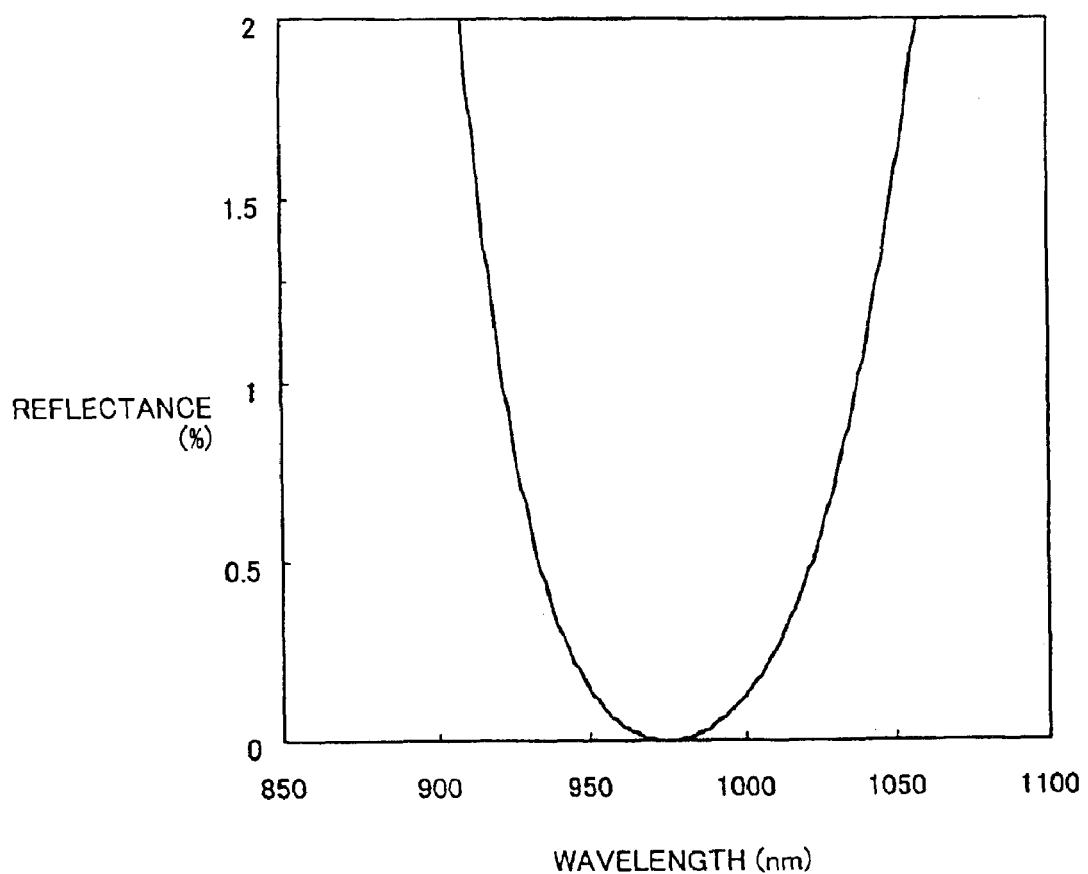

Herein, the thickness of each film is as follows. First film/second film/third film/fourth film/fifth film/sixth film/seventh film/eighth film=$d_3$/$Ad_2$/$Bd_1$/$Bd_2$/$Cd_1$/$Cd_2$/$Dd_1$/$Dd_2$/=20 nm/45.22 nm/53.23 nm/215.32 nm/53.23 nm/215.32 nm/53.23 nm/215.32 nm. FIG. 32 shows the wavelength dependence of the reflectance of the nonreflective film. The 1% or lower reflectance wavelength range of the nonreflective film is 115 nm.

Furthermore will be described the nonreflective film with the first film 51 of alumina ($Al_2O_3$) having thickness $d_3$ of 40 nm. The nonreflective film allows reflectance to be zero for wavelength $\lambda$=980 nm when A=0.30, B=1.95, C=2.00 and D=2.00 and when phases $\phi_1$ and $\phi_3$ of tantalum oxide and silicon oxide are 0.356112 and 1.00038, respectively.

Herein, the thickness of each film is as follows. First film/second film/third film/fourth film/fifth film/sixth film/seventh film/eight film=$d_3$/$Ad_2$/$Bd_1$/$Bd_2$/$Cd_1$/$Cd_2$/$Dd_1$/$Dd_2$=40 nm/31.54 nm/52.27 nm/205.03 nm/53.61 nm/210.28 nm/53.61 nm/210.28 nm. The total film thickness is 1370.80 nm, which is about 5.6 times larger than 245 nm, one forth of wavelength $\lambda$.

Figure 33:
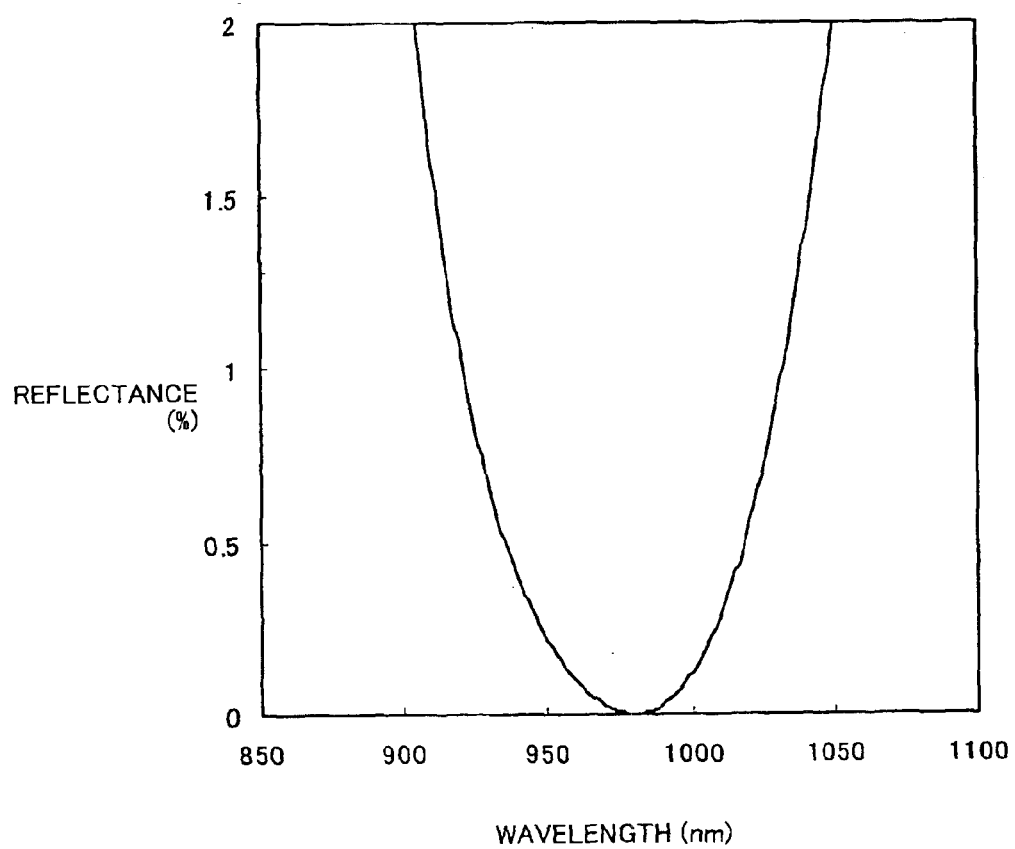

As such, the total film thickness of the nonreflective film is much larger than that of the conventional nonreflective film. The wavelength dependence of the reflectance of the nonreflective film is similar to a bathtub curve, as shown in FIG. 33. Furthermore, the 1% or lower reflectance wavelength range of the nonreflective film is 110 nm, which is much larger than that of the conventional nonreflective film.

To set the desired wavelength $\lambda$=980 nm as the center of the bathtub curve of the reflectance distribution, phases $\phi_1$ and $\phi_3$ of tantalum oxide and silicon oxide are set to 0.356344 and 1.0013, respectively, and for a wavelength $\lambda$=983 nm the reflectance of the nonreflective film attains zero.

Figure 34:
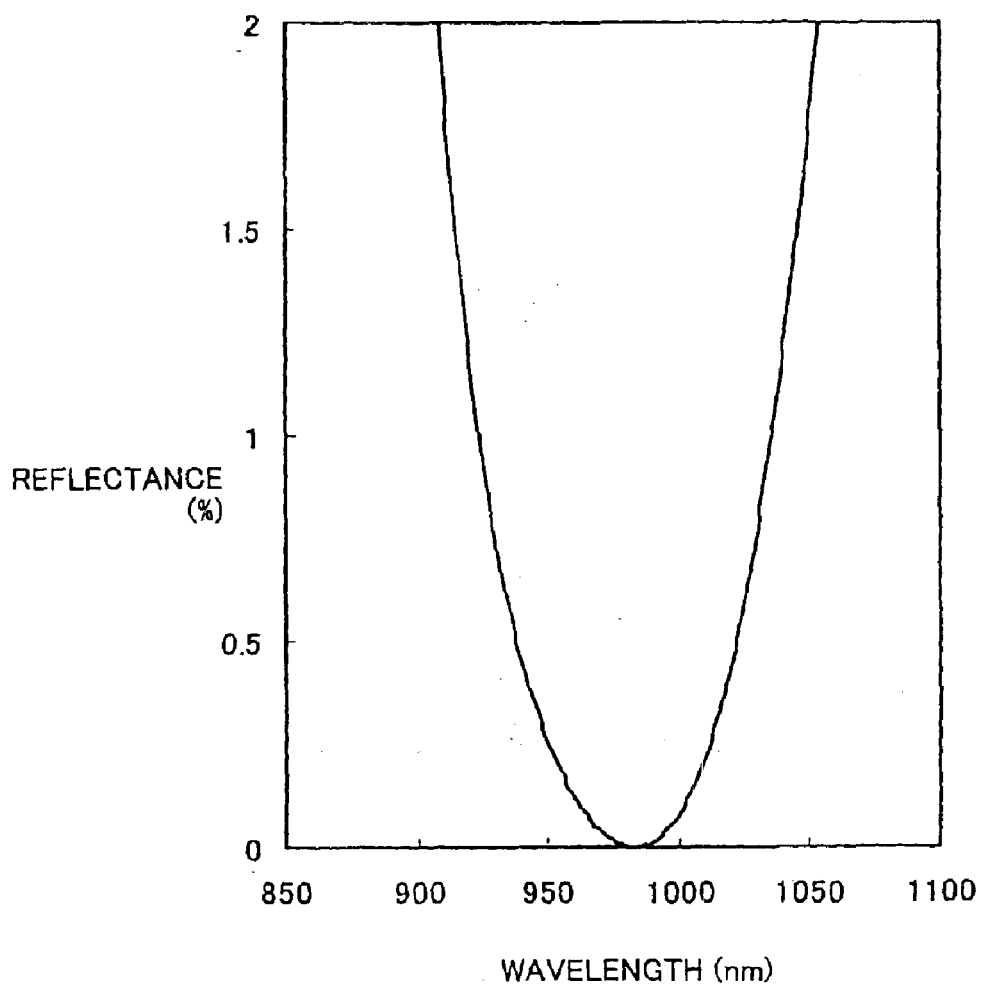

Herein, the thickness of each film is as follows. First film/second film/third film/fourth film/fifth film/sixth film/seventh film/eighth film=$d_3$/$Ad_2$/$Bd_1$/$Bd_2$/$Cd_1$/$Cd_2$/$Dd_1$/$Dd_2$/=40 nm/31.67 nm/52.47 nm/205.85 nm/53.81 nm/211.12 nm/53.81 nm/211.12 nm. FIG. 34 shows the wavelength dependence of the reflectance of the nonreflective film. The 1% or lower reflectance wavelength range of the nonreflective film is 111 nm.

Note that the aforementioned 8-layer nonreflective film is designed using the following expression:

$$\begin{pmatrix} m_{11} & m_{12} \\ m_{21} & m_{22} \end{pmatrix} = \begin{pmatrix} \cos\phi_3 & -\frac{i}{n_3}\sin\phi_3 \\ -in_3\sin\phi_3 & \cos\phi_3 \end{pmatrix} \times \begin{pmatrix} \cos A\phi_2 & -\frac{i}{n_2}\sin A\phi_2 \\ -in_2\sin A\phi_2 & \cos A\phi_2 \end{pmatrix} \times \begin{pmatrix} \cos B\phi_1 & -\frac{i}{n_1}\sin B\phi_1 \\ -in_1\sin B\phi_1 & \cos B\phi_1 \end{pmatrix} \times \begin{pmatrix} \cos B\phi_2 & -\frac{i}{n_2}\sin B\phi_2 \\ -in_2\sin B\phi_2 & \cos B\phi_2 \end{pmatrix} \times \begin{pmatrix} \cos C\phi_1 & -\frac{i}{n_1}\sin C\phi_1 \\ -in_1\sin C\phi_1 & \cos C\phi_1 \end{pmatrix} \times \begin{pmatrix} \cos C\phi_2 & -\frac{i}{n_2}\sin C\phi_2 \\ -in_2\sin C\phi_2 & \cos C\phi_2 \end{pmatrix} \times \begin{pmatrix} \cos D\phi_1 & -\frac{i}{n_1}\sin D\phi_1 \\ -in_1\sin D\phi_1 & \cos D\phi_1 \end{pmatrix} \times \begin{pmatrix} \cos D\phi_2 & -\frac{i}{n_2}\sin D\phi_2 \\ -in_2\sin D\phi_2 & \cos D\phi_2 \end{pmatrix} \quad (9)$$

When expression (9) is used, thicknesses $d_1$ and $d_2$ are calculated to bring to zero each of the real and imaginary parts of amplitude reflectance (r) represented in expression (3c).

Seventh Embodiment

A seventh embodiment provides a semiconductor optical device, as will be described hereinafter with reference to FIGS. 35–41.

Figure 35:
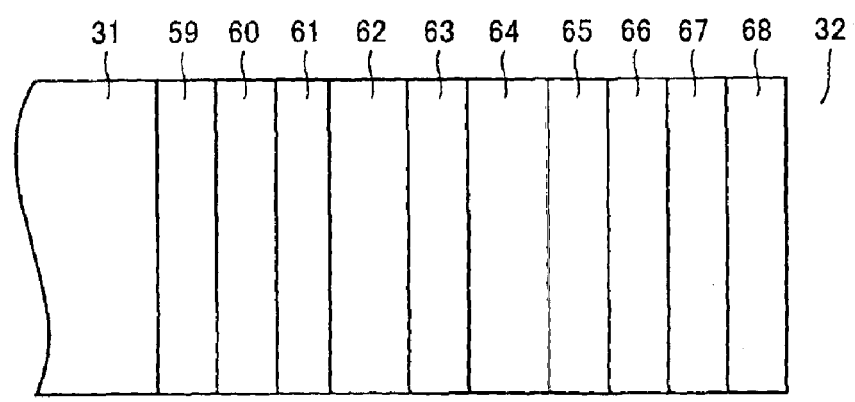
FIG. 35 shows a nonreflective film of a semiconductor laser in a seventh embodiment.

As shown in FIG. 35, the present embodiment provides a semiconductor optical device including semiconductor laser 31 and a non-reflective film provided in space 32 of air, nitrogen or the like having a refractive index of one. The non-reflective film is formed of two specific types of film known in refractive index and unknown in thickness that are stacked in four stages to provide an 8-layer structure, and additional, two specific types of film known in refractive index and known in thickness.

As shown in FIG. 35, the nonreflective film includes a first film 59 of alumina ($Al_2O_3$) (refractive index $n_3=1.629$, thickness $d_3$), a second film 60 of silicon oxide ($SiO_2$) (refractive index $n_2=1.484$, thickness=$Ad_2$), a third film 61 of tantalum oxide ($Ta_2O_5$) (refractive index $n_1=2.072$, thickness=$Bd_1$), a fourth film 62 of silicon oxide ($SiO_2$) (refractive index $n_2=1.484$, thickness=$Bd_3$), a fifth film 63 of tantalum oxide ($Ta_2O_5$) (refractive index $n_1=2.072$, thickness=$Cd_1$), a sixth film 64 of silicon oxide ($SiO_2$) (refractive index $n_2=1.484$, thickness=$Cd_2$), a seventh film 65 of tantalum oxide ($Ta_2O_5$) (refractive index $n_1=2.072$, thickness=$Dd_1$), an eighth film 66 of silicon oxide ($SiO_2$) (refractive index $n_2=1.484$, thickness=$Dd_2$), a ninth film 67 of tantalum oxide ($Ta_2O_5$) (refractive index $n_1=2.072$, thickness=$Ed_1$) and a tenth film 68 of silicon oxide (refractive index $n_2=1.484$, thickness=$Ed_2$).

Initially will be described the nonreflective film with the first film 59 of alumina ($Al_2O_3$) having thickness $d_3$ of 10 nm.

The above mentioned nonreflective film allows reflectance to be zero for wavelength $\lambda=980$ nm when $A=0.62$, $B=2.00$, $C=2.00$, $D=2.00$ and $E=2.00$ and when phases $\phi_1$ and $\phi_2$ of tantalum oxide and silicon oxide are 0.276571 and 1.1374, respectively.

Herein, the thickness of each film is as follows. First film/second film/third film/fourth film/fifth film/sixth film/seventh film/eighth film/ninth film/tenth film=$d_3$/$Ad_2$/$Bd_1$/$Bd_2$/$Cd_1$/$Cd_2$/$Dd_1$/$Dd_2$/$Ed_1$/$Ed_2$=10 nm/74.12 nm/41.64 nm/239.09 nm/41.64 nm/239.09 nm/51.64 nm/239.09 nm/41.64 nm/239.09 nm. The total film thickness is 1890.63 nm, which is about 7.7 times larger than 245 nm, one forth of wavelength $\lambda$. The total film thickness of the nonreflective film is much larger than that of the conventional nonreflective film.

Figure 36:
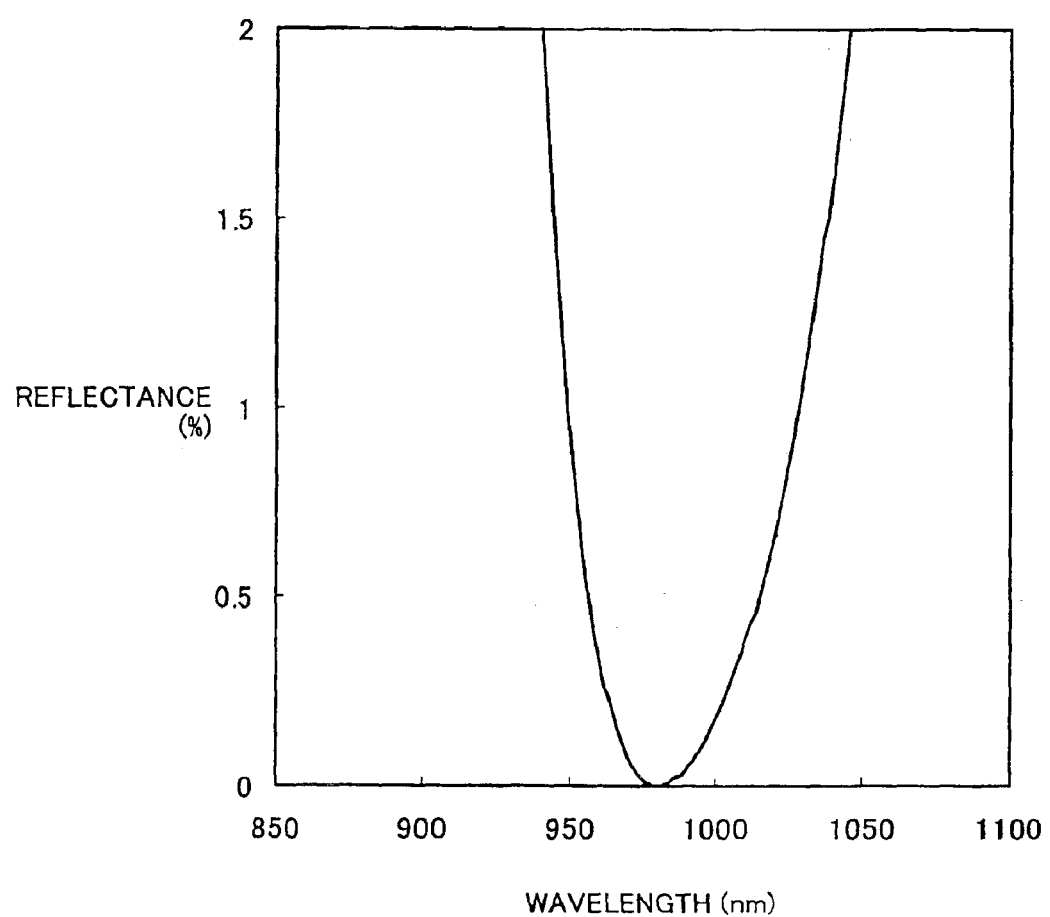
FIGS. 36–41 show wavelength dependence of a reflectance of a nonreflective film of a semiconductor laser in first to sixth examples, respectively, of the seventh embodiment.

The wavelength dependence of the reflectance of the nonreflective film is similar to a bathtub curve, as shown in FIG. 36. Furthermore, the 1% or lower reflectance wavelength range of the nonreflective film is 79 nm, which is larger than that of the conventional nonreflective film.

To set the desired wavelength $\lambda=980$ nm as the center of the bathtub curve of the reflectance distribution, phases $\phi_1$ and $\phi_2$ of tantalum oxide and silicon oxide are set to 0.276804 and 1.13636, respectively, and for wavelength $\lambda=971$ nm the reflectance of the nonreflective film attains zero.

Figure 37:
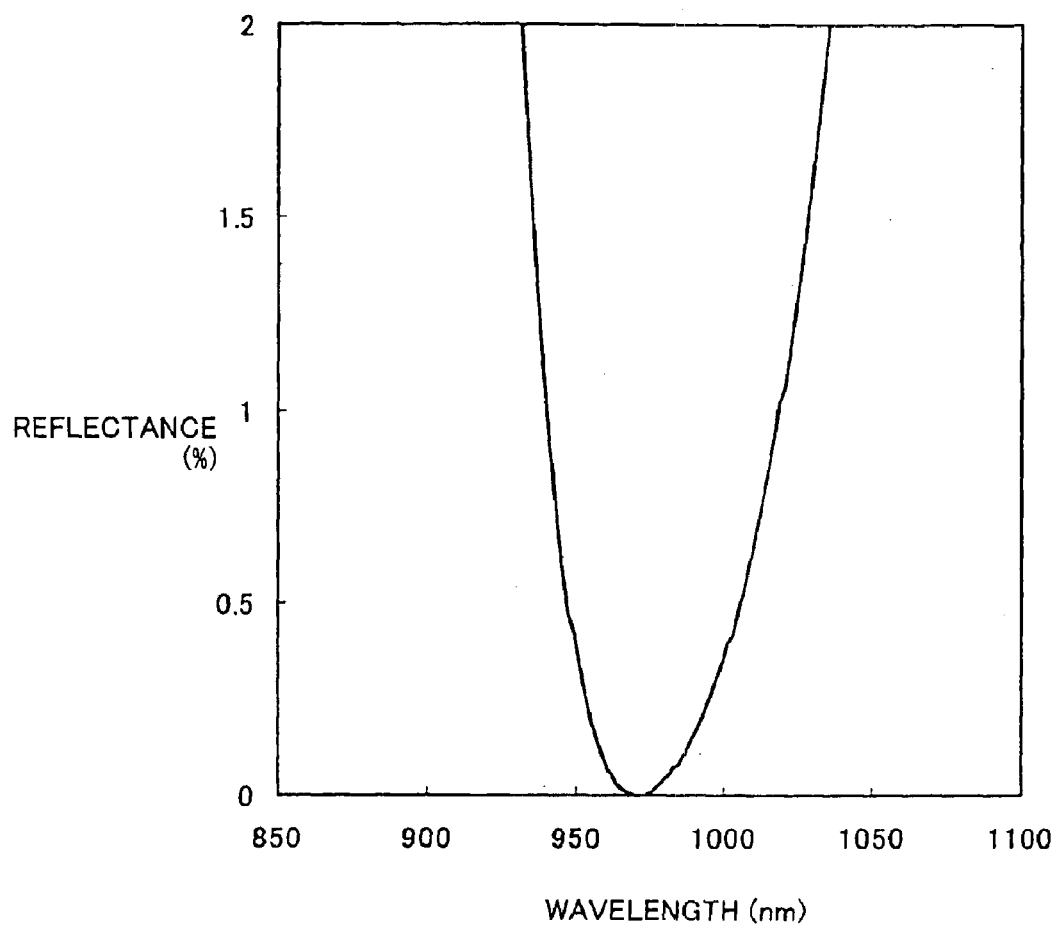

Herein, the thickness of each film is as follows. First film/second film/third film/fourth film/fifth film/sixth film/seventh film/eighth film/ninth film/tenth film=$d_3$/$Ad_3$/$Bd_1$/$Bd_2$/$Cd_1$/$Cd_2$/$Dd_1$/$Dd_2$/$Ed_1$/$Ed_2$=10 nm/73.37 nm/41.29 nm/236.67 nm/41.29 nm/236.67 nm/41.29 nm/236.67 nm/41.29 nm/236.67nm. FIG. 37 shows the wavelength dependence of the reflectance of the nonreflective film. The 1% or lower reflectance wavelength range of the nonreflective film is 77 nm.

Subsequently will be described the nonreflective film with the first film 59 of alumina ($Al_2O_3$) having thickness $d_3$ of 20 nm. The above mentioned nonreflective film allows reflectance to be zero for wavelength $\lambda=980$ nm when $A=0.54$, $B=2.00$, $C=2.00$, $D=2.00$ and $E=2.00$ and when phases $\phi_1$ and $\phi_2$ of tantalum oxide and silicon oxide are 0.2754045 and 1.1399, respectively.

Herein, the thickness of each film is as follows. First film/second film/third film/fourth film/fifth film/sixth film/seventh film/eighth film/ninth film/tenth film=$d_3$/$Ad_2$/$Bd_1$/$Bd_2$/$Cd_1$/$Cd_2$/$Dd_1$/$Dd_2$/$Ed_1$/$Ed_2$=20 nm/64.70 nm/41.41 nm/239.61 nm/41.41 nm/239.61 nm/41.41 nm/239.61 nm/41.41 nm/239.61 nm. The total film thickness is 1894.13 nm, which is about 7.7 times larger than 245 nm, one forth of wavelength $\lambda$. The total film thickness of the nonreflective film is much larger than that of the conventional nonreflective film.

Figure 38:
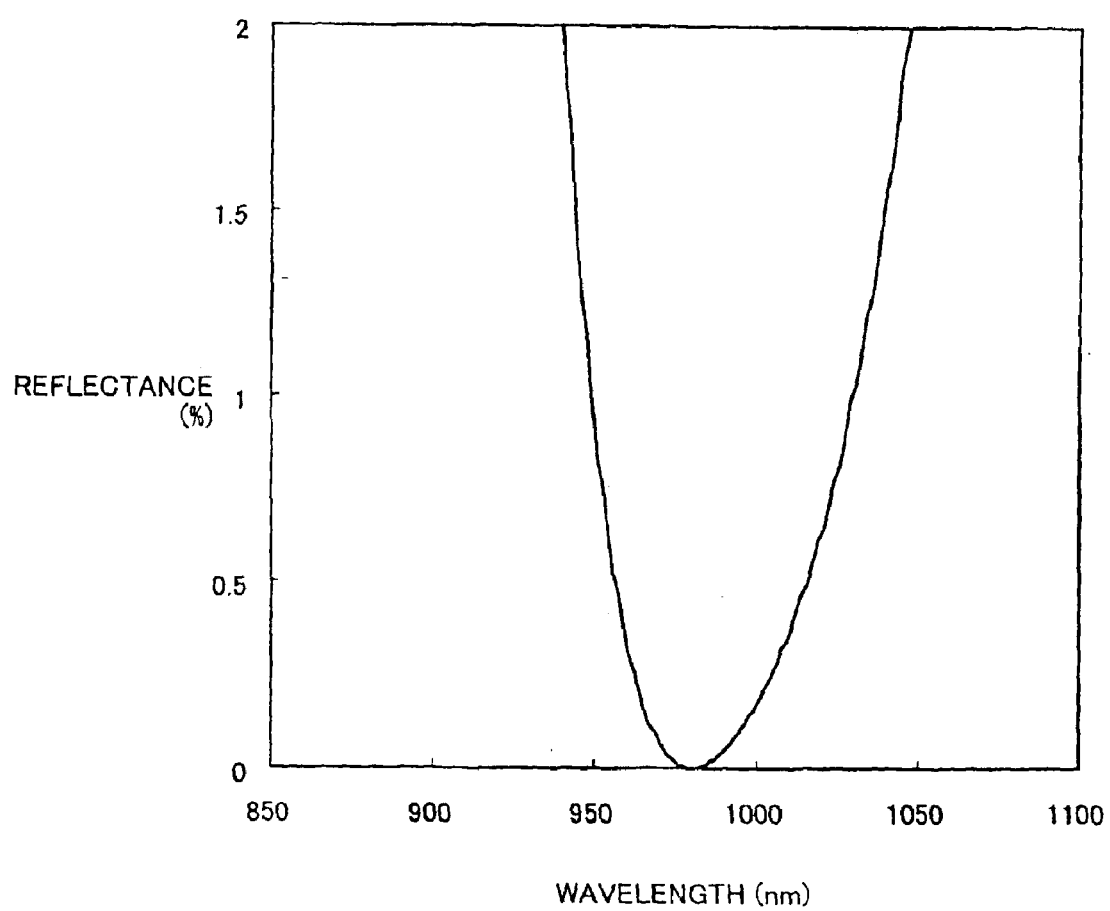

The wavelength dependence of the reflectance of the nonreflective film is similar to a bathtub curve, as shown in FIG. 38. The 1% or lower reflectance wavelength range of the nonreflective film is 80 nm, which is larger than that of the conventional nonreflective film.

To set the desired wavelength $\lambda=980$ nm as the center of the bathtub curve of the reflectance distribution, phases $\phi_1$ and $\phi_2$ of tantalum oxide and silicon oxide are set to 0.275567 and 1.13754, respectively, and for wavelength $\lambda=971$ nm the reflectance of the nonreflective film attains zero.

Figure 39:
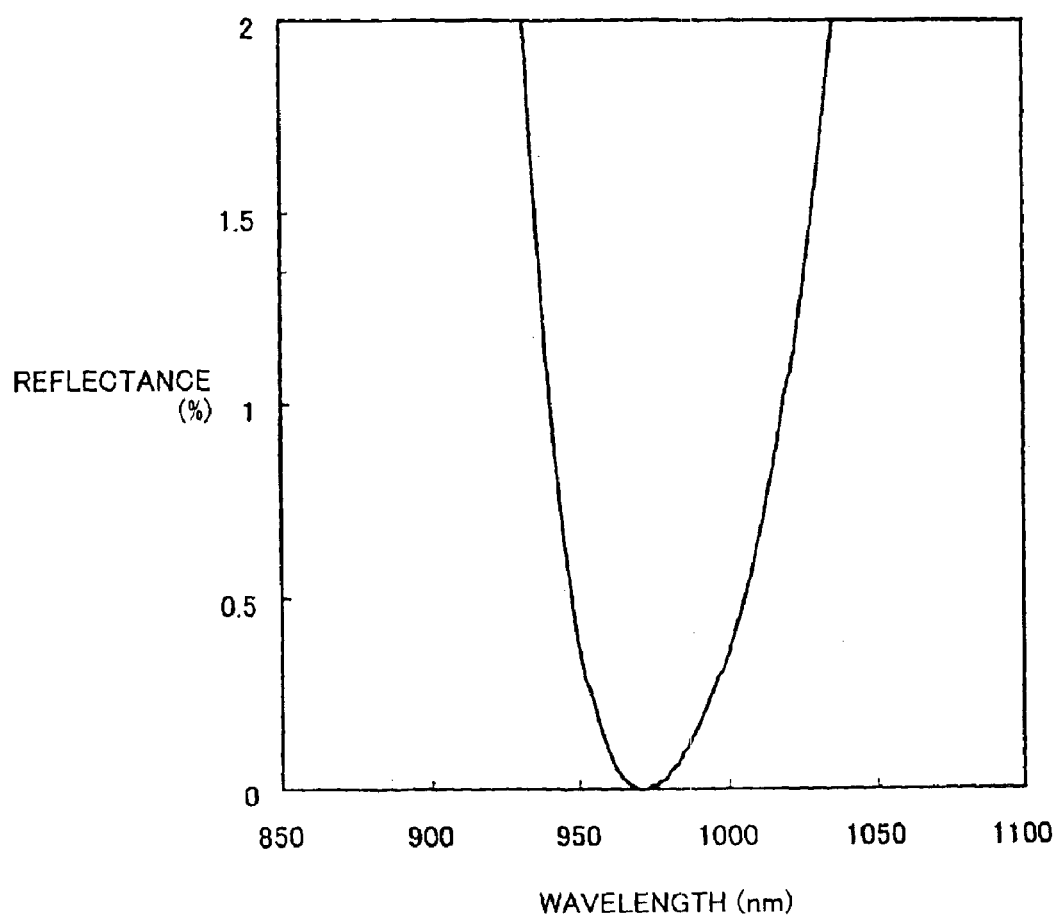

Herein, the thickness of each film is as follows. First film/second film/third film/fourth film/fifth film/sixth film/seventh film/eighth film/ninth film/tenth film=$d_3$/$Ad_2$/$Bd_1$/$Bd_2$/$Cd_1$/$Cd_2$/$Dd_1$/$Dd_2$/$Ed_1$/$Ed_2$=20 nm/63.97 nm/41.11 nm/236.92 nm/41.11 nm/236.92 nm/41.11 nm/236.92 nm/41.11 nm/236.92 nm. FIG. 39 shows the wavelength dependence of the reflectance of the nonreflective film. The 1% or lower reflectance wavelength range of the nonreflective film is 79 nm.

Subsequently will be described the nonreflective film with the first film 59 of alumina ($Al_2O_3$) having thickness $d_3$ of 40 nm. The above mentioned nonreflective film allows reflectance to be zero for wavelength $\lambda=980$ nm when $A=0.40$, $B=2.00$, $C=2.00$, $D=2.00$ and $E=2.00$ and when phases $\phi_1$ and $\phi_2$ of tantalum oxide and silicon oxide are 0.275565 and 1.11479, respectively.

Herein, the thickness of each film is as follows. First film/second film/third film/fourth film/fifth film/sixth film/seventh film/eighth film/ninth film/tenth film=$d_3$/$Ad_2$/$Bd_1$/$Bd_2$/$Cd_1$/$Cd_2$/$Dd_1$/$Dd_2$/$Ed_1$/$Ed_2$=40 nm/46.87 nm/41.49 nm/234.34 nm/41.49 nm/234.34 nm/41.49 nm/234.34 nm/41.49 nm/234.34 nm. The total film thickness is 1869.63 nm, which is about 7.6 times larger than 245 nm, one forth of wavelength $\lambda$. The total film thickness of the nonreflective film is much larger than that of the conventional nonreflective film.

Figure 40:
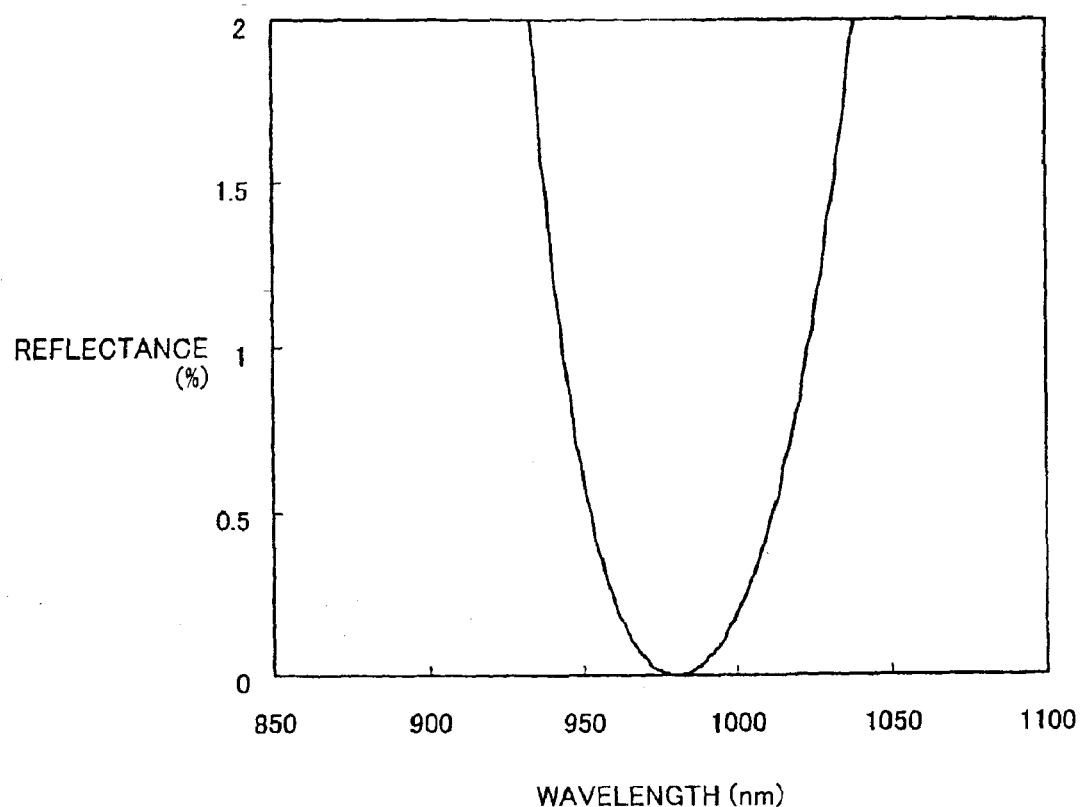

The wavelength dependence of the reflectance of the nonreflective film is similar to a bathtub curve, as shown in FIG. 40. The 1% or lower reflectance wavelength range of the nonreflective film is 79 nm, which is larger than that of the conventional nonreflective film.

To set the desired wavelength $\lambda=980$ nm as the center of the bathtub curve of the reflectance distribution, phases $\phi_1$ and $\phi_2$ of tantalum oxide and silicon oxide are set to 0.275663 and 1.11367, respectively, and for wavelength $\lambda=977$ nm the reflectance of the nonreflective film attains zero.

Figure 41:
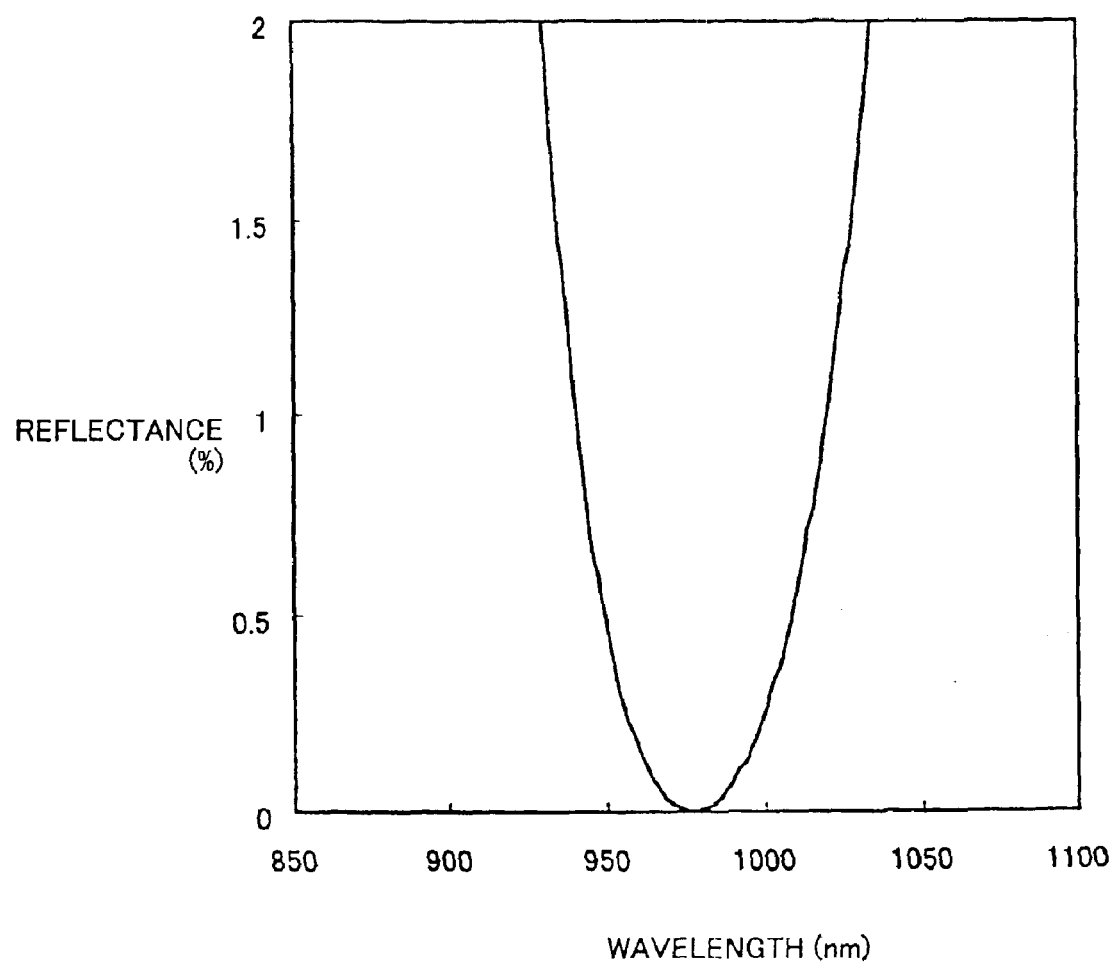

Herein, the thickness of each film is as follows. First film/second film/third film/fourth film/fifth film/sixth film/seventh film/eighth film/ninth film/tenth film=$d_3$/$Ad_2$/$Bd_1$/$Bd_2$/$Cd_1$/$Cd_2$/$Dd_1$/$Dd_2$/$Ed_1$/$Ed_2$=40 nm/46.68 nm/41.37 nm/233.38 nm/41.37 nm/233.38 nm/41.37 nm/233.38 nm/41.37 nm/233.38 nm. FIG. 41 shows the wavelength dependence of the reflectance of the nonreflective film. The 1% or lower reflectance wavelength range of the nonreflective film is 78 nm.

Furthermore the above mentioned 10-layer nonreflective film is designed using the following expression:

$$\begin{pmatrix} m_{11} & m_{12} \\ m_{21} & m_{22} \end{pmatrix} = \quad (10)$$

$$\begin{pmatrix} \cos\phi_3 & -\dfrac{i}{n_3}\sin\phi_3 \\ -in_3\sin\phi_3 & \cos\phi_3 \end{pmatrix} \times \begin{pmatrix} \cos A\phi_2 & -\dfrac{i}{n_2}\sin A\phi_2 \\ -in_2\sin A\phi_2 & \cos A\phi_2 \end{pmatrix} \times$$

$$\begin{pmatrix} \cos B\phi_1 & -\dfrac{i}{n_1}\sin B\phi_1 \\ -in_1\sin B\phi_1 & \cos B\phi_1 \end{pmatrix} \times \begin{pmatrix} \cos B\phi_2 & -\dfrac{i}{n_2}\sin B\phi_2 \\ -in_2\sin B\phi_2 & \cos B\phi_2 \end{pmatrix} \times$$

$$\begin{pmatrix} \cos C\phi_1 & -\dfrac{i}{n_1}\sin C\phi_1 \\ -in_1\sin C\phi_1 & \cos C\phi_1 \end{pmatrix} \times \begin{pmatrix} \cos C\phi_2 & -\dfrac{i}{n_2}\sin C\phi_2 \\ -in_2\sin C\phi_2 & \cos C\phi_2 \end{pmatrix} \times$$

$$\begin{pmatrix} \cos D\phi_1 & -\dfrac{i}{n_1}\sin D\phi_1 \\ -in_1\sin D\phi_1 & \cos D\phi_1 \end{pmatrix} \times \begin{pmatrix} \cos D\phi_2 & -\dfrac{i}{n_2}\sin D\phi_2 \\ -in_2\sin D\phi_2 & \cos D\phi_2 \end{pmatrix} \times$$

$$\begin{pmatrix} \cos E\phi_1 & -\dfrac{i}{n_1}\sin E\phi_1 \\ -in_1\sin E\phi_1 & \cos E\phi_1 \end{pmatrix} \times \begin{pmatrix} \cos E\phi_2 & -\dfrac{i}{n_2}\sin E\phi_2 \\ -in_2\sin E\phi_2 & \cos E\phi_2 \end{pmatrix}.$$

When expression (10) is used, thicknesses $d_1$ and $d_2$ are calculated to bring to zero each of the real and imaginary parts of amplitude reflectance (r) represented in expression (3c).

Furthermore while parameters A, B, C of the nonreflective film of the fifth to seventh embodiments each have a specific value in each embodiment, the parameters are not limited thereto. The parameters having any other values that allow each of the real and imaginary parts of amplitude reflectance (r) to be zero allow an effect similar to that of the nonreflective film of the fifth to seventh embodiments.

In the fifth to seventh embodiments the semiconductor optical device has been described to include a nonreflective film formed of a plurality of films providing three different refractive indexes by way of example. When the plurality of films excluding two specific types of film is/are provided with a preset condition for phase, i.e., preset in thickness, a nonreflective film formed of a plurality of films providing more than three different refractive indexes including two specific types of film having thickness determined by the above approach bringing to zero each of the real and imaginary part of amplitude reflectance of the plurality of films, can be as effective as that in the fifth to seventh embodiments.

Furthermore, while in the fifth to seventh embodiments the first film of alumina has thickness of 10 nm, 20 nm, 40 nm, the film is not limited to such values.

Furthermore, while in the fifth to seventh embodiments, the nonreflective film has 6-, 8-, 10-layer structures, the nonreflective film having a structure formed of 12 or a larger even number of layers can be as effective as the nonreflective film of the fifth to seventh embodiments.

Furthermore, while in the fifth to seventh embodiments the semiconductor optical device includes a semiconductor optical element outputting light having a wavelength in a vicinity of 980 nm, the element may output light-having a wavelength other than this value. The device that outputs visible light, far infrared radiation, infrared radiation and the like can also achieve an effect similar to that of the semiconductor optical device in the fifth to seventh embodiments.

Furthermore while in the fifth to seventh embodiments the semiconductor optical device uses a semiconductor laser as one example of a semiconductor optical element, a semiconductor optical element in the form of a semiconductor amplifier, a super luminescent diode, an optical modulator or a similar semiconductor optical element can also be as effective as the semiconductor laser.

According to each of the non-reflective films of fifth to seventh embodiments, the semiconductor optical element is adjacent to the first film, and the second film is adjacent to the first film. Each of the first and the second film are formed of material having a refractive index smaller than the square root of the effective refractive index of the semiconductor optical element.

According to the above described configure, light absorption which generates within each of the first film and the second film and at the interface between the first film and the second film can be suppressed. Therefore, it become easy to design the optical element device which is prevented from deterioration of the non-reflection film due to light absorption that generates in the range from the first film to the second.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor optical device, comprising:
a semiconductor optical element; and
a nonreflective film receiving light emitted from said semiconductor optical element and in which incident light interferes with reflected light of a certain wavelength bringing reflectance of the light to substantially zero, wherein
said nonreflective film includes a plurality of films, each film having a refractive index higher than 1,
said plurality of films include a high-refractive index film having a refractive index higher than a square root of an effective refractive index of said semiconductor optical element, and a low-refractive index film having a refractive index lower than the square root of the effective refractive index of said semiconductor optical element,
each of said plurality of films includes a single composition, said plurality of films including at least three different compositions, and
a real part and an imaginary part of an amplitude reflectance of said nonreflective film are respectively zero, as a whole.

2. The semiconductor optical device according to claim 1, wherein a sum of products of respective thicknesses and refractive indices of each film of said plurality of films is larger than one quarter of a wavelength of light emitted from said semiconductor optical element.

3. The semiconductor optical device according to claim 1, wherein a film of said plurality of films that is located adjacent to said semiconductor optical element has a thermal conductivity larger than other films of said plurality of films.

4. The semiconductor optical device according to claim 3, wherein said film adjacent said semiconductor optical element is aluminum nitude.

5. The semiconductor optical device according to claim 1, wherein said nonreflective film has a reflectance no higher than 1% over a wavelength range at least 100 nm wide.

6. The semiconductor optical device according to claim 1, wherein said semiconductor optical element is adjacent to a first layer film of a material having a refractive index smaller than the square root of the effective refractive index of said semiconductor optical element.

7. The semiconductor optical device according to claim 1, wherein said semiconductor optical device is adjacent to a first layer film, and a second layer film is adjacent to the first layer film, each of said first and second layer films being of materials having a refractive index smaller than the square root of the effective refractive index of said semiconductor optical element.

8. The semiconductor optical device according to claim 1, wherein said semiconductor optical element is selected from the group consisting of a semiconductor laser, a semiconductor amplifier, a superluminescent diode, and a semiconductor light modulator.

9. A semiconductor laser module, comprising:
   the semiconductor optical device according to claim 1 including a semiconductor laser as said semiconductor optical element;
   a first reflective film having a higher reflectance than that of said nonreflective film and located outside said semiconductor optical device; and
   a second reflective film located on first end surface of said semiconductor optical device, said nonreflective film being located on a second end of said semiconductor optical device, wherein
   said second reflective film has a higher reflectance than said nonreflective film for light of a prescribed wavelength, and
   light of a specific wavelength reflected from said first reflective film and said second reflective film passes through said nonreflective film and oscillates between said first reflective film and said second reflective film.

10. The semiconductor laser module according to claim 9, wherein said first reflective film is selected from the group consisting of a fiber grating and a filter within an optical fiber.

* * * * *